United States Patent
Zhou et al.

(10) Patent No.: US 12,402,391 B2
(45) Date of Patent: Aug. 26, 2025

(54) STRESSED MATERIAL WITHIN GATE CUT REGION

(71) Applicant: International Business Machines Corporation, Armonk, NY (US)

(72) Inventors: Huimei Zhou, Albany, NY (US); Andrew M. Greene, Slingerlands, NY (US); Michael P. Belyansky, Halfmoon, NY (US); Oleg Gluschenkov, Tannersville, NY (US); Robert Robison, Rexford, NY (US); Juntao Li, Cohoes, NY (US); Richard A. Conti, Altamont, NY (US); Fee Li Lie, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 785 days.

(21) Appl. No.: 17/516,505

(22) Filed: Nov. 1, 2021

(65) Prior Publication Data
US 2023/0139399 A1  May 4, 2023

(51) Int. Cl.
| H10D 84/03 | (2025.01) |
| H01L 21/762 | (2006.01) |
| H10D 30/01 | (2025.01) |
| H10D 30/62 | (2025.01) |
| H10D 30/67 | (2025.01) |
| H10D 62/10 | (2025.01) |

(Continued)

(52) U.S. Cl.
CPC ..... *H10D 84/038* (2025.01); *H01L 21/76224* (2013.01); *H10D 30/024* (2025.01);
(Continued)

(58) Field of Classification Search
CPC ............... H10D 30/024; H10D 30/031; H10D 30/6211; H10D 30/67; H10D 62/118; H10D 84/853
See application file for complete search history.

(56) References Cited

U.S. PATENT DOCUMENTS

| 8,766,364 B2 | 7/2014 | Doornbos |
| 9,136,330 B2 | 9/2015 | Liu |

(Continued)

FOREIGN PATENT DOCUMENTS

| CN | 101677085 A | 3/2010 |
| CN | 107438902 A | 12/2017 |
| CN | 109087888 A | 12/2018 |

OTHER PUBLICATIONS

International Search Report, International Application No. PCT/CN2022/125927, Dec. 27, 2022, 9 pgs.

(Continued)

*Primary Examiner* — Fernando L Toledo
*Assistant Examiner* — Adam S Bowen
(74) *Attorney, Agent, or Firm* — Matthew Zehrer

(57) ABSTRACT

A semiconductor device includes a substrate with a planar top surface. At least a first gate cut stressor within a first gate cut region separates a first transistor region from a second transistor region. The first gate cut stressor is directly upon the planar top surface and applies a first tensile force perpendicular to a channel of the first transistor region and perpendicular to a channel of the second transistor region. The tensile force may improve hole and/or electron mobility within a transistor in the first transistor region and within a transistor in the second transistor region. The gate cut stressor may include a lower material within the gate cut region and an upper material upon the lower material. Alternatively, the gate cut stressor may include a liner material that lines the gate cut region and an inner material upon the liner material.

20 Claims, 9 Drawing Sheets

(51) Int. Cl.
  *H10D 64/01* (2025.01)
  *H10D 84/01* (2025.01)
  *H10D 84/85* (2025.01)

(52) U.S. Cl.
  CPC ....... *H10D 30/031* (2025.01); *H10D 30/6211* (2025.01); *H10D 30/67* (2025.01); *H10D 30/6735* (2025.01); *H10D 62/118* (2025.01); *H10D 64/017* (2025.01); *H10D 84/0188* (2025.01); *H10D 84/853* (2025.01)

(56) References Cited

U.S. PATENT DOCUMENTS

| | | |
|---|---|---|
| 9,373,641 B2 | 6/2016 | Anderson |
| 9,537,007 B2 | 1/2017 | Yang |
| 9,761,495 B1 | 9/2017 | Ruilong |
| 9,991,361 B2 | 6/2018 | Dai |
| 10,014,298 B1 | 7/2018 | Zang et al. |
| 10,056,382 B2 | 8/2018 | Guo |
| 10,176,995 B1 * | 1/2019 | Wu .................. H01L 21/76829 |
| 10,522,679 B2 | 12/2019 | Jha |
| 2011/0169085 A1 | 7/2011 | Xu et al. |
| 2016/0300948 A1 | 10/2016 | Yang et al. |
| 2017/0243790 A1 | 8/2017 | Xie et al. |

OTHER PUBLICATIONS

Pei Zhao et al., "Influence of stress induced CT local layout effect (LLE) on 14nm FinFET," Symposium on VLSI Technology, 2017, pp. T228-T229.

* cited by examiner

STRESSED MATERIAL WITHIN GATE CUT REGION

BACKGROUND

Various embodiments of the present application generally relate semiconductor device fabrication methods and resulting structures. More specifically the various embodiments relate to a semiconductor device, such as a fin field effect transistor (FET) or nanosheet transistor, that includes a stressed material within its gate cut region.

SUMMARY

In an embodiment of the present invention, a semiconductor device is presented. The device includes one or more first fins that extend from a planar top surface of a substrate within a first device region and one or more second fins that extend from the planar top surface of the substrate within a second device region. The device further includes first shallow trench isolation (STI) within the first device region. The first STI is upon the planar top surface of the substrate and upon and between respective lower portion(s) of the one or one or more first fins. The first STI includes a first STI sidewall that faces the second device region. The device further includes a second STI within the second device region. The second STI is upon the planar top surface of the substrate and is upon and between respective lower portion(s) of the one or one or more second fins. The second STI includes a second STI sidewall that faces the first device region. The device includes a first gate within the first device region. The first gate is upon the first STI and is upon and between respective upper portion(s) of the one or more first fins. The first gate includes a first gate sidewall that faces the second device region. The device further includes a second gate within the second device region. The second gate is upon the second STI and is upon and between respective upper portion(s) of the one or more second fins. The second gate includes a second gate sidewall that faces the first device region. The device further includes a gate cut stressor upon the planar top surface of the substrate, upon the first STI sidewall, upon the second STI sidewall, upon the first gate sidewall, and upon the second gate sidewall. The gate cut stressor includes an intrinsic stress that applies a tensile force to the first gate perpendicular to the first fins and to the second gate perpendicular to the second fins.

In an embodiment of the present invention, another semiconductor device is presented. The device includes a substrate comprising a planar top surface. The device includes a first gate cut stressor within a first gate cut region that separates a first transistor region from a second transistor region. The first gate cut stressor is directly upon the planar top surface and applies a first tensile force to a first gate perpendicular to a first channel in the first transistor region and to a second gate perpendicular to a second channel in the second transistor region. The device further includes a second gate cut stressor within a second gate cut region that separates a third transistor region from a fourth transistor region. The second gate cut stressor is directly upon the planar top surface and applies a second tensile force to a third gate perpendicular to a third channel in the third transistor region and to a fourth gate perpendicular to a fourth channel in the fourth transistor region. The second gate cut stressor is formed of a different material relative to the first gate cut stressor.

In another embodiment of the present invention, a semiconductor device fabrication method is presented. The method includes forming a gate cut region that separates a sacrificial gate layer into a first sacrificial gate and a second sacrificial gate and that separates a shallow trench isolation (STI) layer into a first STI and a second STI. The method further includes forming a sacrificial gate cut plug within the gate cut region, removing the first sacrificial gate, and removing the second sacrificial gate. The method includes forming a first replacement gate in place of the removed first sacrificial gate and forming a second replacement gate in place of the removed second sacrificial gate. The method includes removing the sacrificial gate cut plug thereby exposing a first STI sidewall of the first STI, exposing a first gate sidewall of the first replacement gate, exposing a second STI sidewall of the second STI, exposing a second gate sidewall of the second replacement gate, and exposing a portion of an upper surface of a planar substrate. The method further includes forming a gate cut stressor upon the upper surface of the planar substrate, upon the first STI sidewall, upon the second STI sidewall, upon the first gate sidewall, and upon the second gate sidewall. The gate cut stressor includes an intrinsic stress that applies a tensile force along the first gate and along the second gate.

These and other embodiments, features, aspects, and advantages will become better understood with reference to the following description, appended claims, and accompanying drawings.

DETAILED DESCRIPTION

Figure 1:
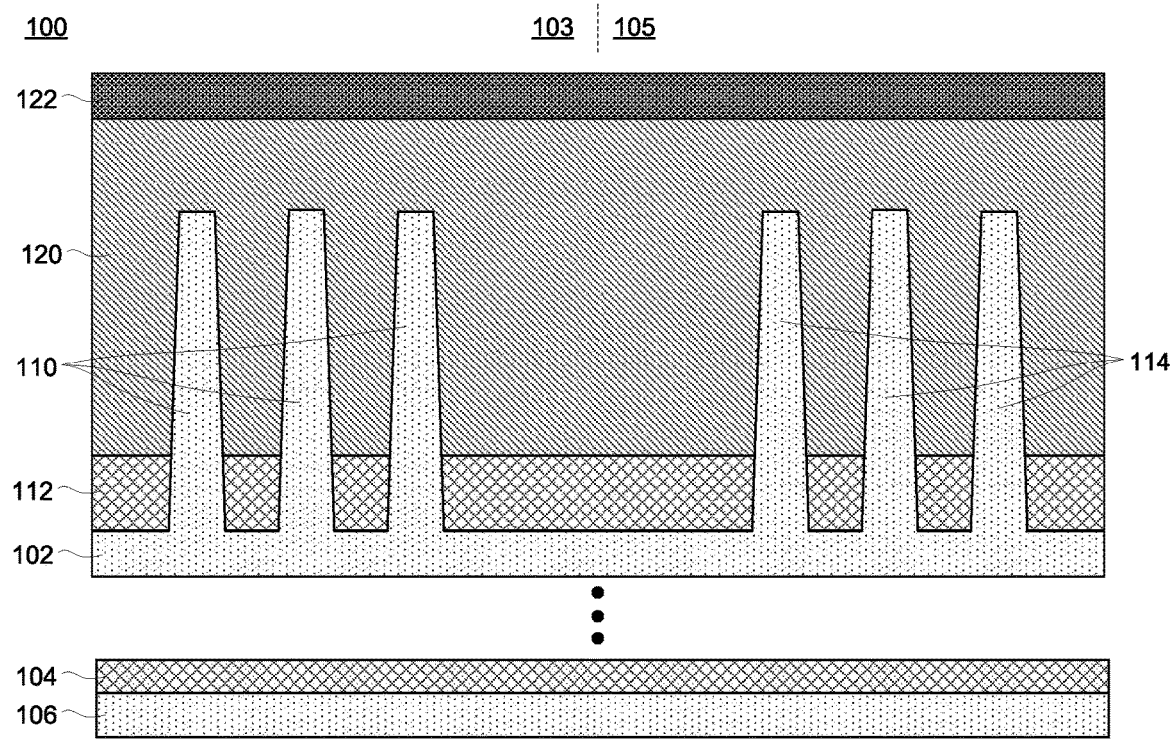
FIG. 1 through FIG. 10 depicts cross-sectional views of a semiconductor structure shown after fabrication operations, in accordance with one or more embodiments.

It is understood in advance that although a detailed description is provided herein of an exemplary fin FET and/or nanosheet architecture that has a stress material within its gate cut region, implementation of the teachings recited herein are not limited to the particular device architecture described herein. Rather, embodiments of the present invention are capable of being implemented in conjunction with any other appropriate type of transistor device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

FIG. 1 depicts a cross-sectional view of semiconductor structure 100 shown after fabrication operations, in accordance with one or more embodiments. After such fabrication operations, semiconductor device 100 may include a first device region 103, a second device region 105, a substrate 102, one or more fins 110 within the first device region 103, one or more fins 114 within second device region 105, a shallow trench isolation (STI) layer 112 upon the substrate 102 and between the one or more fins 110 and between the one or more fins 114, and one or more sacrificial gates 120 with a gate mask 122 thereupon.

First device region 103 may include a nFET and second device region 105 may include a pFET, or vice versa. As such, the transistor within first device region 103 may be of a first dopant type and the transistor within the second device region may be of a second dopant type. Alternatively, first device region 103 may include a first nFET and second device region 105 may include a second nFET. Similarly, first device region 103 may include a first pFET and second device region 105 may include a second pFET. As such, the transistors within first device region 103 and within the second device region 105 may be of the same dopant type.

Figure 5:
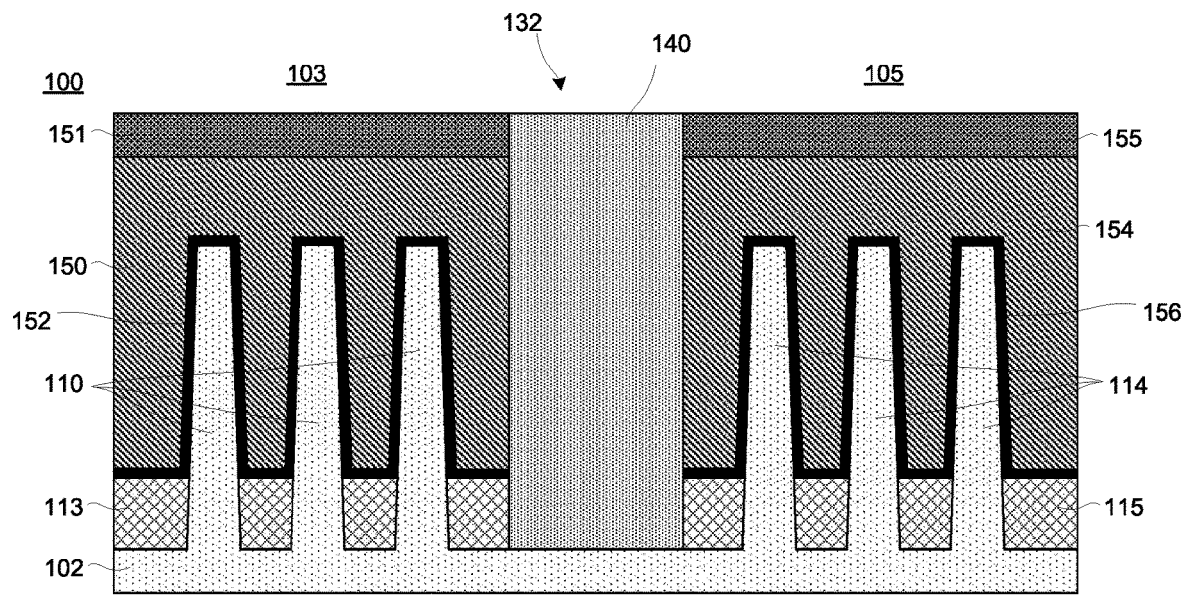
Figure 6:
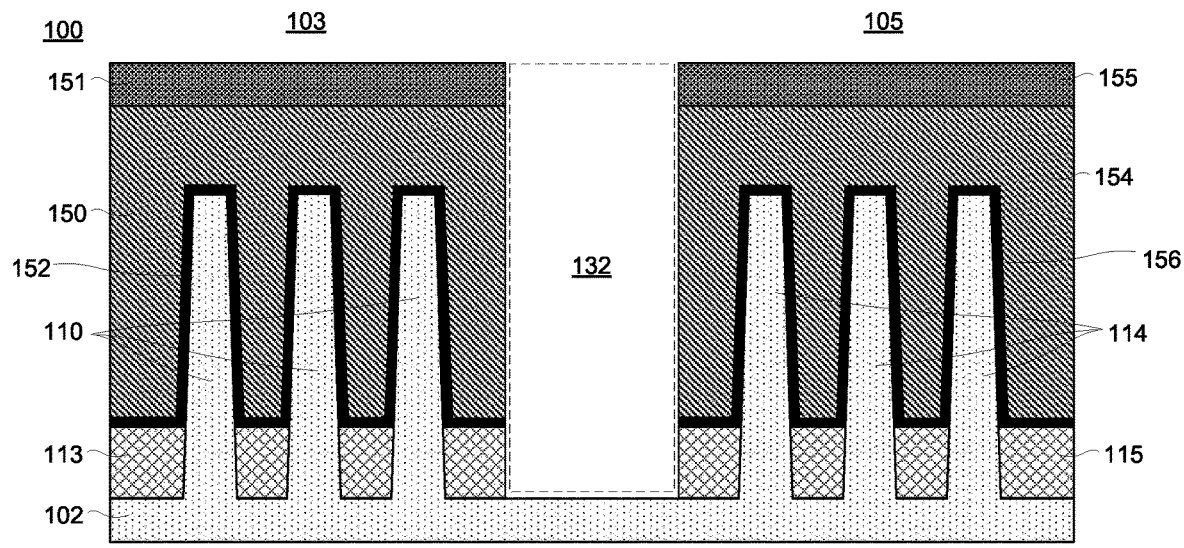

Generally, first device region 103 and second device region 105 may be associated with transistor(s) that are associated with physically and/or electrically distinct or separated gates. For example, as shown in FIG. 5 and FIG. 6, a transistor within first device region 103 has a replacement gate 150 and a transistor within second device region 105 has a replacement gate 154 that is physically and electrically distinct, isolated, and/or separated from replacement gate 150 by a gate cut region 132.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk substrate. Alternatively, the substrate 102 may be one layer or a top layer of a multi-layered substrate. For example, substrate 102 may be a top layer of a substrate on insulator (e.g., silicon on insulator (SOI), or the like) that may include a lower substrate 106, such as a Si substrate 104, an insulator 104, such as a SiO insulator, upon the lower substrate 104, and the top substrate 102 upon the insulator 106. The substrate 102 may be dopped, as is known in the art, so as to form the appropriate dopant type of the transistor in the first device region 103 and the appropriate dopant type of the transistor in the second device region 105.

When Si-containing substrate 102 is employed, it may have different surface crystallographic orientations. Common substrate 102 surface orientations are {100}, {110}, and {111}, while {100} crystallographic orientation is more typical due to its inherent crystallographic symmetry with respect to its response to asymmetric surface stressors imparted by useful surface structures. Furthermore, useful structures that are built on the substrate surface maybe aligned to a particular crystallographic direction that is chosen based on substrate crystallography. Such reference crystallographic direction for a substrate 102 is often made visible to the substrate alignment equipment by placing a physical notch, flat, or other marker at the substrate perimeter. Typical crystallographic direction between such marker and the substrate center is <110> for Si-containing substrate 102 with {100} surface orientation. If the reference crystallographic direction to the substrate notch or other marker is different from <110> the substrate can be referred to as rotated.

In one embodiment, utilizing known patterning, lithography, etching, etc. techniques, undesired portions of the substrate 102 may be removed while desired portions thereof may be retained and may form fins 110 and fins 114. Fins 110 and fins 114 can be patterned by conventional patterning techniques, such as Self-Aligned Double Patterning (SADP), Self-Aligned Quadruple Patterning (SAQP), etc. As fins 110 and fins 114 may be formed from subtracting material(s) from substrate 102, fins 110 and fins 114 may retain the material properties (e.g., dopants, or the like) therefrom.

In another embodiment, utilizing known deposition techniques, fins 110 and fins 114 may be formed upon substrate 102. Fins 110 and fins 114 could be positively formed upon substrate 102 by known deposition techniques such PVD, CVD, ALD, Epitaxial growth, or the like. In this embodiment, fins 110 and fins 114 may be dopped, as is known in the art, so as to form the appropriate dopant type of the transistor in the first device region 103 and the appropriate dopant type of the transistor in the second device region 105.

In one embodiment, the fins 110 and fins 114 have crystalline sidewalls that are {110} crystallographic planes. These planes may provide increased hole mobility and are therefore preferred. This can be accomplished by selecting a {100} surface substrate and aligning fins perpendicular to <110> direction. For a normal, nonrotated {100} substrate 102, aligning fins perpendicular to notch-center line produces {110} fin sidewalls and sets <110> crystallographic direction along the fins 110, 114.

STI region(s), an STI layer, or the like, which may be collectively referred herein as STI 112, may be formed by depositing STI material(s), such as silicon nitride (SiN), Silicon Dioxide (SiO$_2$), a combination of SiN and Silicon Dioxide (SiO$_2$) by different deposition method, upon the substrate 102, upon and between fins 110, and upon and between fins 114. STI 112 may be formed by depositing the STI material(s) by for example, PVD, CVD, ALD, or the like. As is known in the art, STI 122 may, at least partially, electrically isolate neighboring transistor components or features. For example, STI 112 may at least partially physically and electrically isolate one fin 110 from a neighboring fin 110, may physically and electrically isolated fins 110 from fins 114, or the like.

In some embodiments, a sacrificial gate 120 material layer may be formed upon STI 112, upon and between fins 110, and upon and between fins 114. The sacrificial gate 120 material layer may be formed by known deposition techniques such PVD, CVD, ALD, or the like. The sacrificial gate 120 material layer may be formed to a thickness greater than the height of fins 110 and/or fins 114. For example, the top surface of the sacrificial gate 120 material layer may be above the top surface of fins 110 and/or fins 114. The sacrificial gate 120 material layer can have a thickness of from about 30 nm to about 200 nm, although other thicknesses are within the contemplated scope.

Subsequently a gate mask 122 layer may be formed upon the sacrificial gate 120 material layer. The gate mask 122 layer may be a hard mask layer. Exemplary gate mask 122 layer materials may be SiN, SiO$_2$, a combination of SiN and SiO$_2$, SiON, SICN, SIOCN, or the like. The gate mask 122 material layer may be formed by known deposition techniques such PVD, CVD, ALD, or the like. The gate mask 122 material layer can have a thickness of from about 1 nm to about 200 nm, although other thicknesses are within the contemplated scope.

Utilizing known patterning, lithography, etching, etc. techniques, undesired portions of the gate mask 122 material layer may be removed, followed by further removal of the sacrificial gate 110 material layer that is not covered by an associated gate mask 122, while desired portions of the sacrificial gate 120 material layer thereupon may be retained. These retained features may respectively form one or more sacrificial gates 120 with a gate mask 122 thereupon. The combined structure of the sacrificial gate 120 and the associated gate mask 122 thereupon may be referred herein as a sacrificial gate structure. Multiple sacrificial gate structures may be arranged in an in-out of the page perspective, with respect to the exemplary cross section of FIG. 1. In some embodiments, a gate spacer may be formed upon each of the opposing sidewalls of the sacrificial gate structure(s), as is known in the art.

Figure 2:
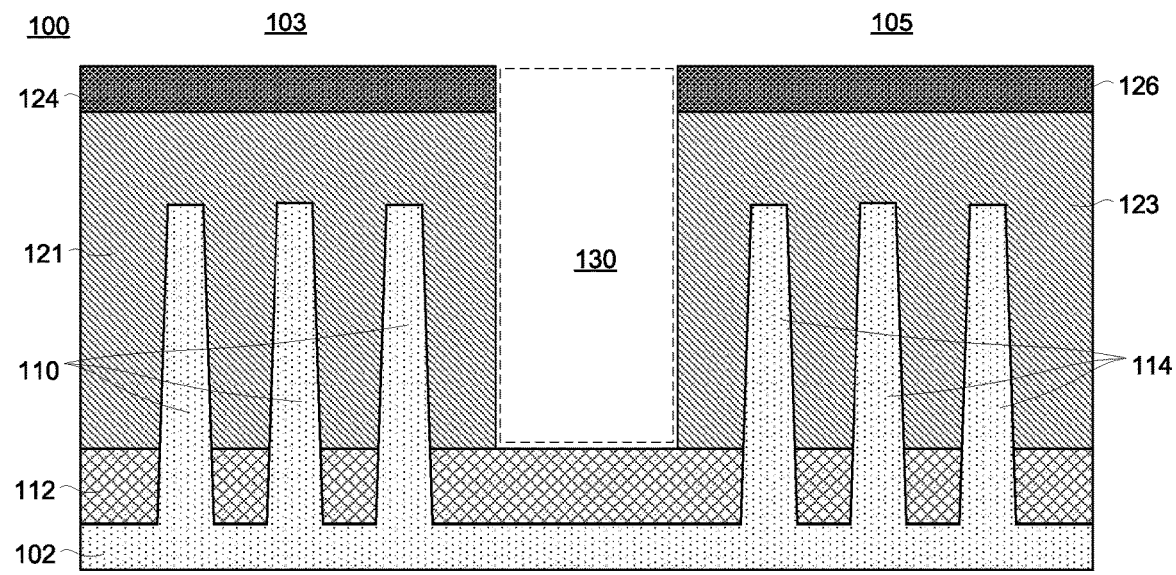

FIG. 2 depicts a cross-sectional view of semiconductor structure 100 shown after fabrication operations, in accordance with one or more embodiments. After such fabrication operations, semiconductor device 100 may include a partial gate cut region 130 physically separates sacrificial gate 121 within first device region 103 from sacrificial gate 123 within second device region 105.

In a particular implementation, an undesired portion of gate mask 124 may be removed to expose a portion of the sacrificial gate 120 there below. The undesired portion of gate mask 124 may be removed known removal techniques such as e.g., patterning, lithography, etching, or the like. The removal of the portion of gate mask 124 splits the gate mask 122 into at least gate mask 124 located within first device region 103 and gate mask 126 located within second device region 105.

Subsequently, the unprotected portion of the sacrificial gate 120 may be removed to form partial gate cut region 130. The unprotected portion of the sacrificial gate 120 may be removed known removal techniques such as e.g., patterning, lithography, etching, or the like. The removal of the unprotection portion of sacrificial gate 120 splits the sacrificial gate 120 into at least sacrificial gate 121 located within first device region 103 and sacrificial gate 123 located within second device region 105.

Partial gate cut region 130 may be an opening, trench, or the like, and may include an inner facing sidewall(s) of gate mask 124, an inner facing sidewall(s) of sacrificial gate 121, an inner facing sidewall(s) of gate mask 126, and an inner facing sidewall(s) of sacrificial gate 123. A bottom or well surface of the partial gate cut region 130 may be at least an exposed portion of the upper surface of STI 112.

Figure 3:
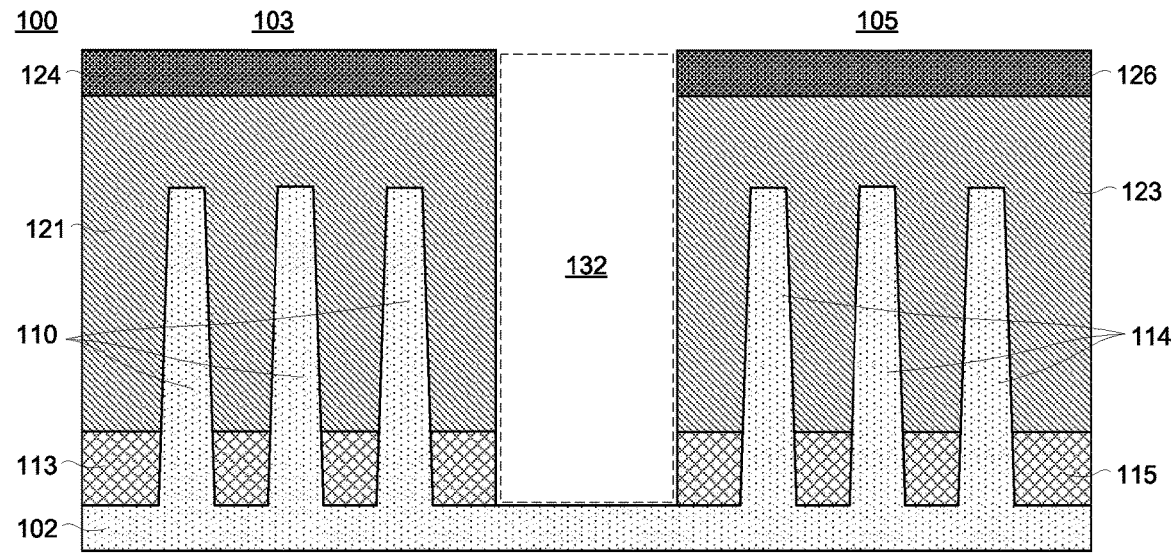

FIG. 3 depicts a cross-sectional view of semiconductor structure 100 shown after fabrication operations, in accordance with one or more embodiments. After such fabrication operations, semiconductor device 100 may include a gate cut region 132 that physically separates sacrificial gate 121 within first device region 103 from sacrificial gate 123 within second device region 105 and that physically separates STI 113 within first device region 103 from STI 115 within second device region 105.

In a particular implementation, the portion of the upper surface of STI 112 exposed by partial gate cut region 130 may be removed to expose a portion of the substrate 102 there below. This portion of the upper surface of STI 112 may be removed known removal techniques such as e.g., patterning, lithography, etching, punch-through processing, or the like. The removal of this portion of the upper surface of STI 112 splits STI 112 into at STI 113 located within first device region 103 and STI 115 located within second device region 105.

Gate cut region 132 may be an opening, trench, or the like, and may include an inner facing sidewall(s) of gate mask 124, an inner facing sidewall(s) of sacrificial gate 121, an inner facing sidewall(s) of gate mask 126, an inner facing sidewall(s) of sacrificial gate 123, an inner facing sidewall(s) of STI 113, and an inner facing sidewall(s) of STI 115.

In embodiments, as depicted, a bottom or well surface of the gate cut region 132 may be at least an exposed portion of the upper surface substrate 102. In some embodiments, the bottom or well surface of the gate cut region 132 may be at least an exposed portion of substrate 102 that is below the upper surface substrate 102. In other words, gate cut region 132 may extend below the top surface of substrate 102 by way of further removal of a portion of the substrate 102. An example of this type of gate cut region extending below the top surface of the substrate 102 is exemplary shown in FIG. 11.

Figure 4:
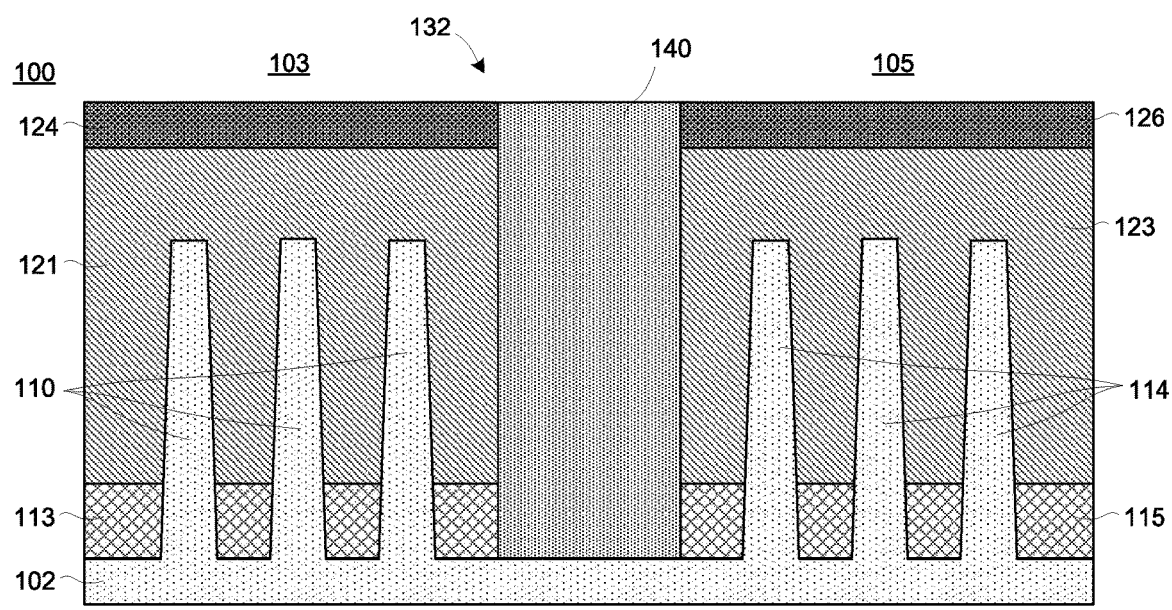

FIG. 4 depicts a cross-sectional view of semiconductor structure 100 shown after fabrication operations, in accordance with one or more embodiments. After such fabrication operations, semiconductor device 100 may include a sacrificial gate cut plug 140 within gate cut region 132. The sacrificial gate cut plug 140 physically separates sacrificial gate 121 from sacrificial gate 123 and physically separates STI 113 from STI 115.

Sacrificial gate cut plug 140 may be formed by depositing a dielectric material upon substrate 102 and upon the inner facing sidewalls of gate cut region 132. For example, the sacrificial gate cut plug 140 can be formed by any suitable techniques such as deposition (ALD, CVD, etc.).

Sacrificial gate cut plug 140 can have a width of from about 30 nm to about 200 nm. In some embodiments, the sacrificial gate cut plug 140 can have a width of from about 5 nm to about 50 nm, although other widths are within the contemplated scope of the invention. Exemplary sacrificial gate cut plug 140 material may be but are not limited to: silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, a sacrificial metal upon a liner as an insulator, combinations thereof, etc. The sacrificial gate cut plug 140 can be a low-k material having a dielectric constant less than about 7, less than about 5.

After formation of sacrificial gate cut plug 140, excessive sacrificial gate cut plug 140 material can be removed by an etching or polish process, such as a chemical mechanical polish (CMP). Removal of the excess sacrificial gate cut plug 140 material can be accomplished using, for example, a selective wet etch process, or a selective dry etch process, or other subtractive removal technique, as is known in the art. As such, the top surface of gate mask 124, gate mask 126, and sacrificial gate cut plug 140 may be coplanar.

Though not shown or described semiconductor structure 100 may undergo interim fabrication operations, such as source and drain formation, or the like, prior to the fabrication of replacement gate structures, as described below. Such fabrication techniques and structures are known and are omitted here.

FIG. 5 depicts a cross-sectional view of semiconductor structure 100 shown after fabrication operations, in accordance with one or more embodiments. After such fabrication operations, semiconductor device 100 may include a replacement gate structure formed in place of each sacrificial gate structure. For example, a replacement gate structure within the first device region 103 may be formed by initially removing the sacrificial gate 121 and gate mask 124 associated therewith, forming a gate dielectric 152 upon STI 113 and upon fins 110, forming a gate conductor, hereinafter referred to as replacement gate 150, upon the gate dielectric 152, and with forming a gate cap 151 upon the replacement gate 150.

Likewise, a replacement gate structure within the second device region 105 may be formed by initially removing the sacrificial gate 123 and gate mask 126 associated therewith, forming a gate dielectric 156 upon STI 115 and upon fins 114, forming a gate conductor, hereinafter referred to as replacement gate 154, upon the gate dielectric 156, and with forming a gate cap 155 upon the replacement gate 154.

Gate dielectric 152, 156 can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric 152, 156 material can be formed by any suitable deposition process or the like. In some embodiments, the gate dielectric 152, 156 material has a thickness ranging from 1 nm to 5 nm, although less thickness and greater thickness are also conceived.

Replacement gate 150, 154 may be formed of any suitable conductive material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition.

In some embodiments, the replacement gate structure may further include a work function setting layer between the gate dielectric 152, 156 and replacement gate 150, 154, respectively. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both replacement gate 150, 154, respectively, and the WFM.

Replacement gate 150, 154 and the WFM (if present) can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc.

Subsequently, a gate cap 151 may be formed upon the replacement gate 150 and a gate cap 155 may be formed upon the replacement gate 154. The gate cap 151, 155 may be a hard mask, or the like. Exemplary gate cap 151, 155 materials may be SiN, SiO$_2$, a combination of SiN and SiO$_2$, SiON, SICN, SIOCN, or the like. The gate cap 151, 155 may be formed by known deposition techniques such PVD, CVD, ALD, or the like. The gate cap 151, 155 material can have a thickness of from about 1 nm to about 200 nm, although other thicknesses are within the contemplated scope.

After formation of replacement gate structures, excessive gate cap 151, 155 materials can be removed by an etching or polish process. Removal of the excess gate cap 151, 155 materials can be accomplished using, for example, a selective wet etch process, or a selective dry etch process, or other subtractive removal technique, as is known in the art. As such, the top surface of gate cap 151, 155 and sacrificial gate cut plug 140 may be coplanar.

FIG. 6 depicts a cross-sectional view of semiconductor structure 100 shown after fabrication operations, in accordance with one or more embodiments. After such fabrication operations, semiconductor device 100 may include an re-formed or otherwise re-exposed gate cut region 132. The gate cut region 132 may be re-exposed by removing sacrificial gate cut plug 140 therewithin.

After such exposure, gate cut region 132 may include inner facing sidewall(s) of gate mask 151, inner facing sidewall(s) of replacement gate 150, inner facing sidewall(s) of gate dielectric 152, and inner facing sidewall(s) of STI 113. Similarly, gate cut region 132 may include inner facing sidewall(s) of gate mask 155, inner facing sidewall(s) of replacement gate 154, inner facing sidewall(s) of gate dielectric 156, and inner facing sidewall(s) of STI 115. Further, after such exposure gate cut region 132 may also include a bottom or well surface as an exposed portion of the substrate 102.

Figure 7:
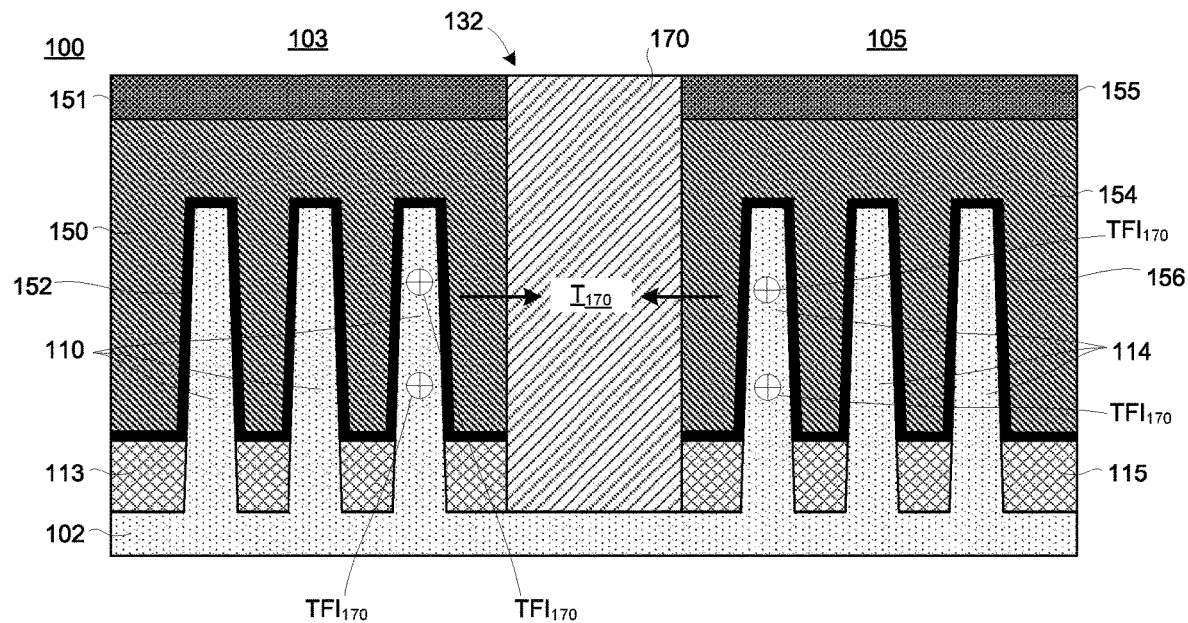

FIG. 7 depicts a cross-sectional view of semiconductor structure 100 shown after fabrication operations, in accordance with one or more embodiments. After such fabrication operations, semiconductor device 100 may include a gate cut stressor 170 within gate cut region 132. The gate cut stressor 170 physically separates gate cap 151, replacement gate 150, gate dielectric 152, and STI 113 from the second device region 105. Similarly, the gate cut stressor 170 physically separates gate cap 155, replacement gate 154, gate dielectric 156, and STI 115 from the first device region 103.

Gate cut stressor 170 may be formed by depositing a dielectric material upon substrate 102 and upon the inner facing sidewalls of gate cut region 132.

Gate cut stressor 170 can have a width of from about 30 nm to about 200 nm. In some embodiments, the sacrificial gate cut stressor 170 can have a width of from about 5 nm to about 50 nm, although other widths are within the contemplated scope of the invention. Exemplary sacrificial gate cut stressor 170 material may be but are not limited to: SiN, SiC, SiON, SiOC, SiCN, BN, SiBN, SiBCN, SiOCN, SiO$_x$, a replacement metal upon a liner as an insulator, combinations thereof, etc. Further, the gate cut stressor 170 can be a low-k material having a dielectric constant less than about 7, less than about 5.

After formation of gate cut stressor 170, excessive gate cut stressor 170 material can be removed by an etching or polish process, such as a chemical mechanical polish (CMP). Removal of the excess gate cut stressor 170 material can be accomplished using, for example, a selective wet etch process, or a selective dry etch process, or other subtractive removal technique, as is known in the art. As such, the top surface of gate cap 151, gate cap 155, and gate cut stressor 170 may be coplanar.

Gate cut stressor 170 has an internal or intrinsic tension or stress, such that there is an internally generated effective force $T_{170}$ that attempts to compress or shrink the gate cut stressor 170 internally pulling the adjacent the first device region 103 and toward the second device region 105 laterally or horizontally, as depicted. This internal tension applied to the gate material 150, 154 creates tensile stress within the gate material 150, 154 along the gate direction and within the fins 110, 114 perpendicular to the fin 110, 114 direction. In turn, this tensile stress may resultingly create a smaller compressive stress $TFI_{170}$ along the fins 110, 114 (into and/or out of the page, as depicted) through the stress mixing Poisson effect. These forces and stresses within fins 110, 114 may improve hole mobility and/or electron mobility therewithin. In one embodiment, the fin 110, 114 are aligned along <110> crystallographic direction and have {110} oriented crystallographic sidewalls. In this arrangement, both hole mobility and electron mobility improve. Hole mobility is improved through the secondary compressive $TFI_{170}$ force, while electron mobility is improved through the primary tensile $T_{170}$ force. Here, electron mobility may improve by a larger factor. However, because both electron mobility and hole mobility may improve, the inclusion of gate cut stressor 170 may be particularly useful for CMOS switching devices.

Gate cut stressor 170 may be formed by plasma enhanced chemical vapor deposition (PECVD), or the like, such that respective process parameters, such as composition of carrier gases and reactive gases, substrate temperature, deposition pressure and, in particular, ion bombardment during the deposition, may significantly influence the finally obtained intrinsic stress of gate cut stressor 170 as deposited with respect to the underlying or otherwise surrounding material(s). High level of intrinsic tensile stress in the gate cut stressor 170 can be also produced by an annealing or curing step that induces shrinkage of gate cut stressor 170 material. This additional step can be conducted immediately after gate cut stressor 170 material deposition or later in the process flow. In one example, such additional annealing or curing step detaches hydrogen from within the gate cut stressor 170 material, producing stretched chemical bonds within, that yield a high level of tensile intrinsic stress. For example, when gate cut stressor 170 is deposited and annealed within gate cut region 132 a high intrinsic tensile stress of up to 2 GPa or even significantly higher may be achieved by e.g., detaching hydrogen during or after deposition or, alternatively, reducing ion bombardment by establishing the deposition atmosphere with a low level of radio frequency (RF) power so as to obtain the desired internally generated effective force $T_{170}$ that attempts to compress or shrink the gate cut stressor 170 internally away from both first device region 103 and second device region 105 laterally.

Figure 8:
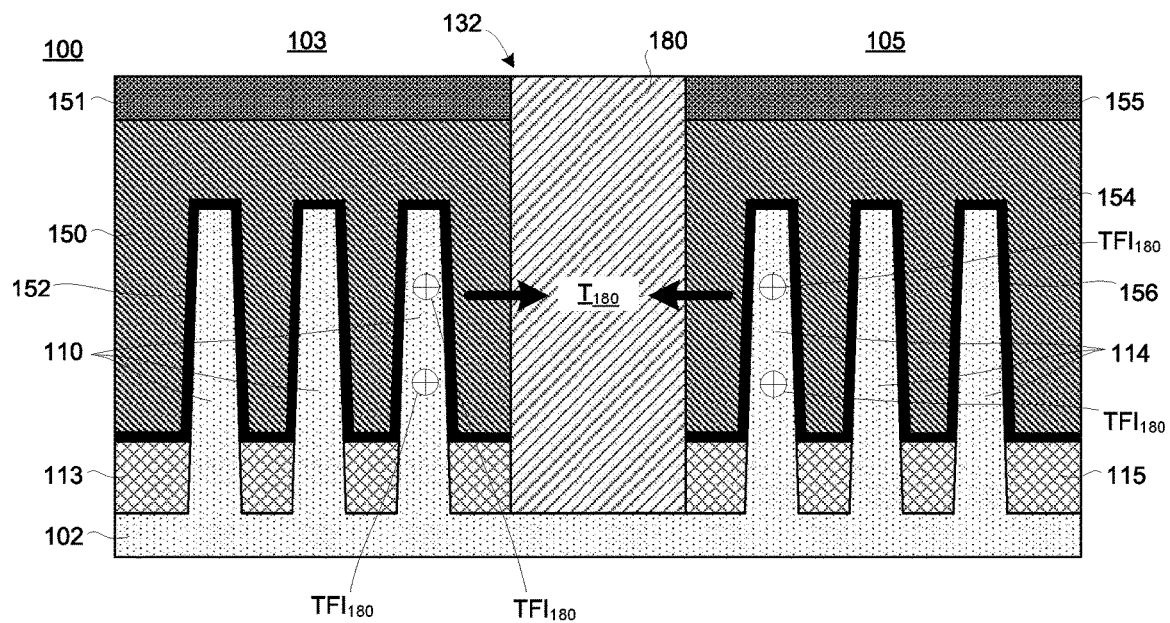

FIG. 8 depicts a cross-sectional view of semiconductor structure 100 shown after fabrication operations, in accordance with one or more embodiments. After such fabrication operations, semiconductor device 100 may include a gate cut stressor 180 within gate cut region 132. The gate cut stressor 180 physically separates gate cap 151, replacement gate 150, gate dielectric 152, and STI 113 from the second device region 105. Similarly, the gate cut stressor 180 physically separates gate cap 155, replacement gate 154, gate dielectric 156, and STI 115 from the first device region 103.

Gate cut stressor 180 may be formed by depositing dielectric material(s), different than the dielectric material(s) of gate cut stressor 170, upon substrate 102 and upon the inner facing sidewalls of gate cut region 132.

Gate cut stressor 180 can have a width of from about 30 nm to about 200 nm. In some embodiments, the sacrificial gate cut stressor 170 can have a width of from about 5 nm to about 50 nm, although other widths are within the contemplated scope of the invention. Exemplary sacrificial gate cut stressor 180 material may be but are not limited to: SiN, SiC, SiON, SiOC, SiCN, BN, SiBN, SiBCN, SiOCN, $SiO_x$, a replacement metal upon a liner as an insulator, combinations thereof, etc. The gate cut stressor 180 can be a After formation of gate cut stressor 180, excessive gate cut stressor 180 material can be removed by an etching or polish process, such as a chemical mechanical polish (CMP). Removal of the excess gate cut stressor 180 material can be accomplished using, for example, a selective wet etch process, or a selective dry etch process, or other subtractive removal technique, as is known in the art. As such, the top surface of gate cap 151, gate cap 155, and gate cut stressor 180 may be coplanar.

Gate cut stressor 180 has an internal or intrinsic tension or stress, such that there is an internally generated effective force $T_{180}$ that attempts to compress or shrink the gate cut stressor 180 internally pulling adjacent the first device region 103 and toward the second device region 105 laterally or horizontally, as depicted. This internal tension applied to the gate material 150, 154 creates tensile stress within the gate material 150, 154 along the gate direction and within the fins 110, 114 perpendicular to the fin 110, 114 direction. In turn, this tensile stress may resultingly create a smaller compressive stress $TFI_{180}$ along the fins 110, 114 (into and/or out of the page, as depicted) through the stress mixing Poisson effect. These forces and stresses within fins 110, 114 may improve hole mobility and/or electron mobility therewithin. In one embodiment, the fins 110, 114 are aligned along <110> crystallographic direction and have {110} oriented crystallographic sidewalls. In this arrangement, both hole mobility and electron mobility improve. Hole mobility is improved through the secondary compressive $TFI_{180}$ force, while electron mobility is improved through the primary tensile $T_{180}$ force. Here, electron mobility may improve by a larger factor. However, because both electron mobility and hole mobility may improve, the inclusion of gate cut stressor 180 may be particularly useful for CMOS switching devices.

Gate cut stressor 180 may be formed by PECVD, or the like, such that respective process parameters, such as composition of carrier gases and reactive gases, substrate temperature, deposition pressure and, in particular, ion bombardment during the deposition, may significantly influence the finally obtained intrinsic stress of gate cut stressor 180 as deposited with respect to the underlying or otherwise surrounding material(s). High level of intrinsic tensile stress in the gate cut stressor 180 can be also produced by an annealing or curing step that induces shrinkage of gate cut stressor 180 material. This additional step can be conducted immediately after gate cut stressor 180 deposition or later in the process flow. In one example, such additional annealing or curing step detaches hydrogen from within the gate cut stressor 180 material producing stretched chemical bonds within that yield a high level of tensile intrinsic stress. For example, when gate cut stressor 180 is deposited and annealed within gate cut region 132 a high intrinsic tensile stress of up to 2 GPa or even significantly higher may be achieved by e.g., detaching hydrogen during or after deposition or, alternatively, reducing ion bombardment by establishing the deposition atmosphere with a low level of radio frequency (RF) power so as to obtain the desired internally generated effective force $T_{180}$ that attempts to compress or shrink the gate cut stressor 180 internally away from both first device region 103 and second device region 105 laterally.

For clarity, it is to be understood that semiconductor structure 100 may include a first gate cut region 132 that contains gate cut stressor 170 therewithin, as is depicted in FIG. 7 and may further include a different second gate cut region 132 that contains gate cut stressor 180, therewithin, as is depicted in FIG. 8.

Figure 9:
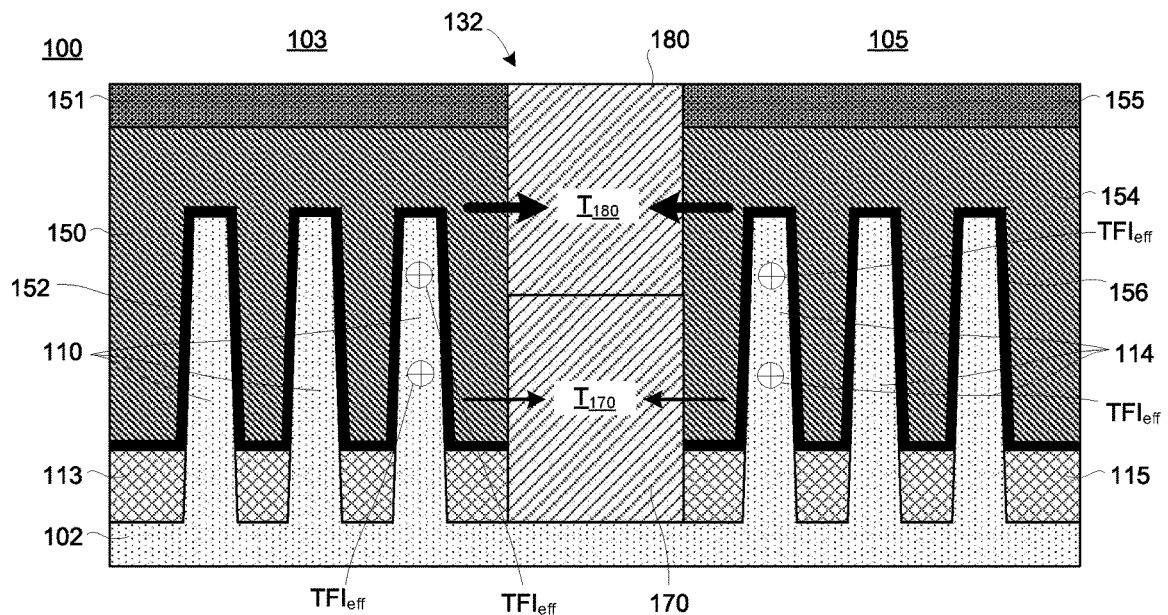

FIG. 9 depicts a cross-sectional view of semiconductor structure 100 shown after fabrication operations, in accordance with one or more embodiments. After such fabrication operations, semiconductor device 100 may include gate cut stressor 180 and gate cut stressor 170 within gate cut region 132. Gate cut stressor 170 may be located in a lower portion of gate cut region 132 and gate cut stressor 180 may be located in an upper portion of gate cut region 132, or vice versa.

The gate cut stressors 170, 180 physically separate gate cap 151, replacement gate 150, gate dielectric 152, and/or STI 113 from the second device region 105, respectively. Similarly, the gate cut stressors 170, 180 physically separates gate cap 155, replacement gate 154, gate dielectric 156, and/or STI 115 from the first device region 103, respectively.

As depicted, gate cut stressor 170 may be initially formed by depositing the gate cut stressor 170 dielectric material upon substrate 102 and upon a lower portion of the inner facing sidewalls of gate cut region 132. Subsequently, gate cut stressor 180 may be formed by depositing the gate cut stressor 180 dielectric material upon gate cut stressor 170 and upon an upper portion of the inner facing sidewalls of gate cut region 132. Alternatively, subsequently to forming the gate cut stressor 170, the gate cut stressor 180 can be formed by curing a top portion of the gate cut stressor 170, thereby effectively forming gate cut stressor 180 that has a relatively higher tensile stress within as compared to the non-cured bottom portion of gate cut stressor 170. In some implementations, curing the entire gate cut stressor 170 to cause a uniform intrinsic tensile stress may not be feasible due to a high aspect ratio of gate cut region 132.

Alternatively, gate cut stressor 180 may be initially formed by depositing the gate cut stressor 180 dielectric material upon substrate 102 and upon a lower portion of the inner facing sidewalls of gate cut region 132. Subsequently, gate cut stressor 170 may be formed by depositing the gate cut stressor 170 dielectric material upon gate cut stressor 180 and upon an upper portion of the inner facing sidewalls of gate cut region 132.

After formation of gate cut stressor 170, 180, excessive gate cut stressor 170, 180 material can be removed by an etching or polish process. As such, the top surface of gate cap 151, gate cap 155, and gate cut stressor 170 or gate cut stressor 180 may be coplanar.

The internally generated tensile force $T_{180}$ is generally larger than internally generated tensile force $T_{170}$. Because the Fin FETs are typically formed in the upper portion of the fins 110, 114, the positive effect of $T_{180}$ may be dominant. This internal tension applied to the gate material 150, 154 creates tensile stress within the gate material along the gate direction and within the fins 110, 114 perpendicular to the fin 110, 114 direction. In turn, this tensile stress may resultingly create a smaller compressive stress $TFI_{eff}$ along the fins 110, 114 (into and/or out of the page, as depicted) through the stress mixing Poisson effect. These forces and stresses within fins 110, 114 may improve hole mobility and/or electron mobility therewithin. In one embodiment, the fin 110, 114 are aligned along <110> crystallographic direction and have {110} oriented crystallographic sidewalls. For this arrangement, both hole mobility and electron mobility improve. While electron mobility may improve by a larger factor, the fact that both electron mobility and hole mobility may improve with gate cut stressor 170, 180 may be particularly useful for CMOS switching devices.

In implementations where relatively improved hole mobility or electron mobility would be beneficial in an upper region of fins 110, 114, it may be beneficial to initially form gate cut stressor 170 within the lower portion of gate cut region 132 and then to subsequently form gate cut stressor 180 upon the gate cut stressor 170 within an upper portion of gate cut region 132.

Alternatively, in implementations where relatively improved hole mobility or electron mobility would be beneficial in an lower region of fins 110, 114, it may be beneficial to initially form gate cut stressor 180 within the lower portion of gate cut region 132 and then to subsequently form gate cut stressor 170 upon the gate cut stressor 180 within the upper portion of gate cut region 132.

Figure 10:
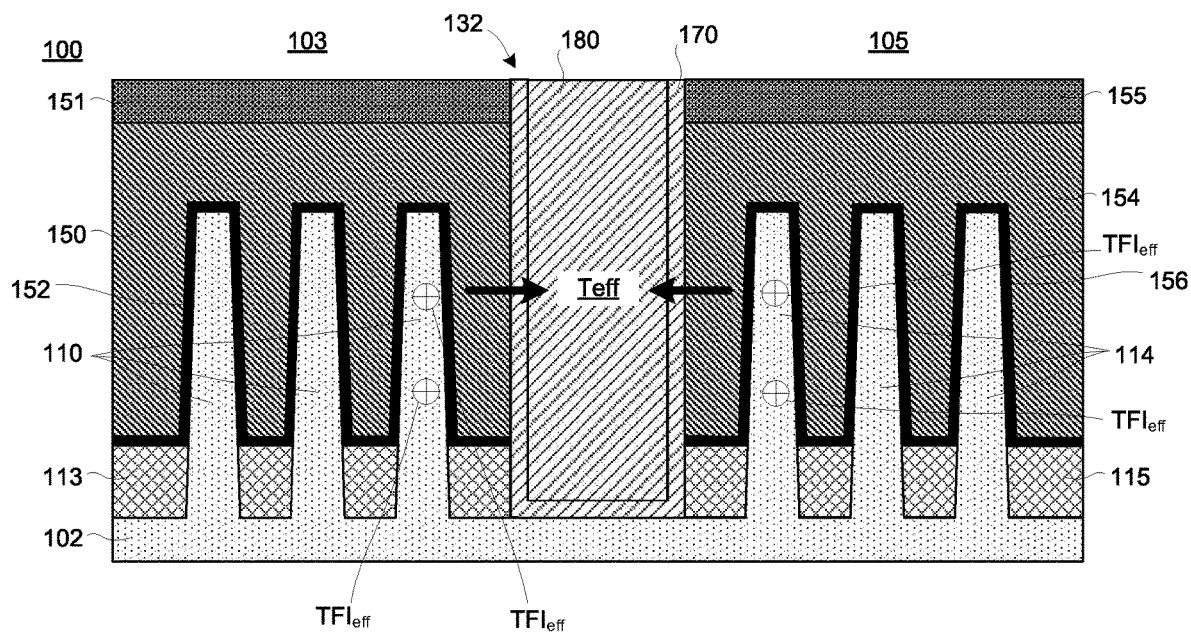

FIG. 10 depicts a cross-sectional view of semiconductor structure 100 shown after fabrication operations, in accordance with one or more embodiments. After such fabrication operations, semiconductor device 100 may include gate cut stressor 180 and gate cut stressor 170 within gate cut region 132. Gate cut stressor 170 may be a liner upon the internal sidewalls of gate cut region 132 and gate cut stressor 180 may be located upon gate cut stressor 170 and filling the remaining gate cut region 132, or vice versa.

The gate cut stressors 170, 180 physically separate gate cap 151, replacement gate 150, gate dielectric 152, and/or STI 113 from the second device region 105, respectively. Similarly, the gate cut stressors 170, 180 physically separates gate cap 155, replacement gate 154, gate dielectric 156, and/or STI 115 from the first device region 103, respectively.

As depicted, gate cut stressor 170 may be initially formed by depositing the gate cut stressor 170 dielectric material upon substrate 102 and upon the inner facing sidewalls of gate cut region 132. This gate cut stressor 170 liner layer can have a thickness of from about 1 nm to about 20 nm, although other thicknesses are within the contemplated scope. Subsequently, gate cut stressor 180 may be formed by depositing the gate cut stressor 180 dielectric material upon gate cut stressor 170 and may generally fill the remaining gate cut region 132.

Alternatively, gate cut stressor 180 may be initially formed by depositing the gate cut stressor 180 dielectric material upon substrate 102 and upon the inner facing sidewalls of gate cut region 132. This gate cut stressor 180 liner layer can have a thickness of from about 1 nm to about 20 nm, although other thicknesses are within the contemplated scope. Subsequently, gate cut stressor 170 may be formed by depositing the gate cut stressor 170 dielectric material upon gate cut stressor 180 and may generally fill the remaining gate cut region 132.

After formation of gate cut stressor 170, 180, excessive gate cut stressor 170, 180 material can be removed by an etching or polish process. As such, the top surface of gate cap 151, gate cap 155, gate cut stressor 170, and gate cut stressor 180 may be coplanar.

The internally generated tensile force $T_{eff}$ applies stress to the gate material 150/154 creating tensile stress within the gate material along the gate direction and within the fins 110, 114 perpendicular to the fin direction. In turn, this tensile stress may resultingly create a smaller compressive stress $TFI_{eff}$ along the fins 110, 114 (into and/or out of the page, as depicted) through the stress mixing Poisson effect. These forces and stresses within fins 110, 114 may improve hole mobility and/or electron mobility therewithin, as described herein.

Figure 11:
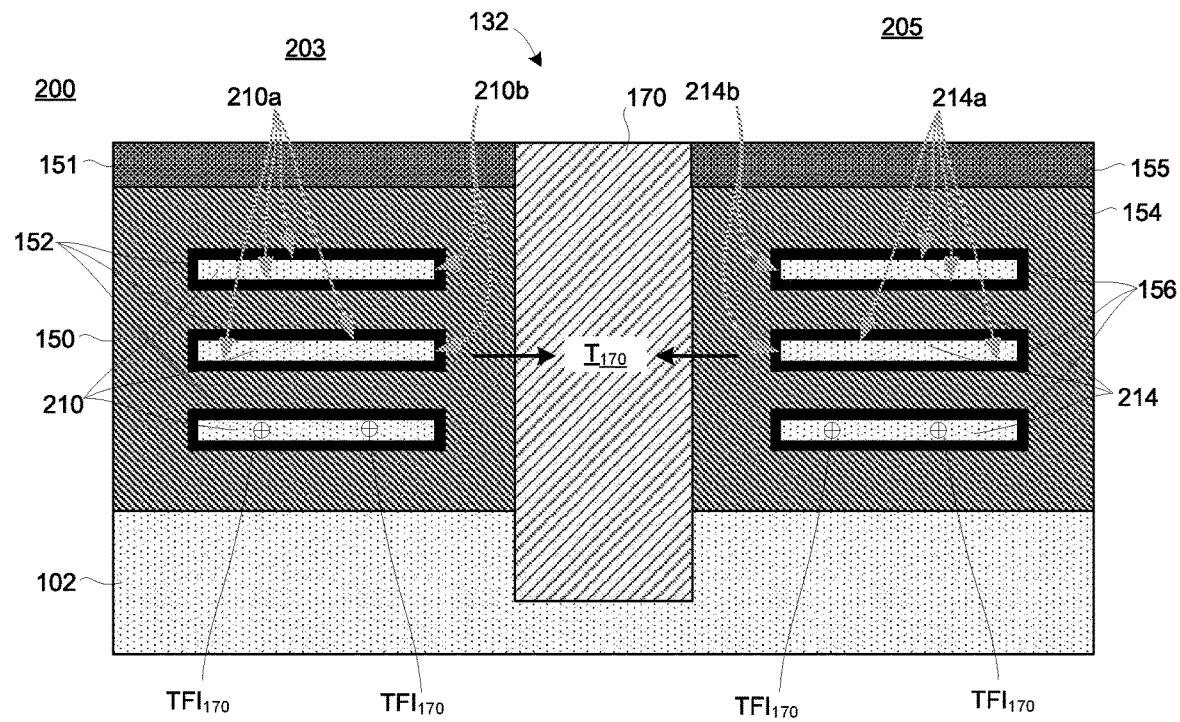
FIG. 11 through FIG. 14 depicts cross-sectional views of a semiconductor structure shown after fabrication operations, in accordance with one or more embodiments.

FIG. 11 depicts a cross-sectional view of semiconductor structure 200 shown after fabrication operations, in accordance with one or more embodiments. After such fabrication operations, semiconductor device 200 may include a first device region 203, a second device region 205, a substrate 102, one or more channel nanosheets 210 within the first device region 203, one or more channel nanosheets 214 within second device region 205, replacement gate 150 upon the substrate 102 and around the one or more channel nanosheets 210, gate cap 151 upon the replacement gate 150, replacement gate 154 upon the substrate 102 and around the one or more channel nanosheets 214, gate cap 155 upon the replacement gate 150, and gate cut stressor 170. Nanosheets 210 and 214 have surfaces 210a and 210b and 214a and 214b, respectively, as depicted. In one embodiment, 210a and 214a surfaces have {100} crystallographic orientation and 210b and 214b surface have {110} crystallographic orientation and nanosheets 210, 214 channel and current flow therewithin is oriented along <110> crystallographic direction.

First device region 203 may include a N-type nanosheet transistor and second device region 205 may include a P-type nanosheet transistor, or vice versa. As such, the transistor within first device region 203 may be of a first dopant type and the transistor within the second device region 205 may be of a second dopant type. Alternatively, first device region 203 may include a first N-type nanosheet transistor and second device region 205 may include a second N-type nanosheet transistor. Similarly, first device region 203 may include a first P-type nanosheet transistor and second device region 205 may include a second P-type nanosheet transistor. As such, the transistor(s) within first device region 203 and within the second device region 205 may be of the same dopant type.

Generally, first device region 203 and second device region 205 may be associated with transistor(s) that are associated with physically and/or electrically distinct or separated replacement gates 150, 154. For example, the nanosheet transistor within first device region 203 has replacement gate 150 and the nanosheet transistor within second device region 205 has replacement gate 154 that is physically and electrically distinct, isolated, and/or separated from replacement gate 150 by gate cut region 132.

Initial fabrication operations of semiconductor device 200 may include forming the substrate 102, forming alternating layers of sacrificial nanosheets and channel nanosheets, and forming a mask layer upon a top sacrificial nanosheet layer. The channel nanosheet layers may be formed from silicon (Si), and the sacrificial nanosheet layers may be formed from silicon germanium (SiGe). The channel nanosheet layers can include, for example, monocrystalline Si. The channel nanosheet layers can have a thickness of, for example, from about 4 to about 10 nm, from about 4 to about 7 nm, or of about 7 nm. In embodiments where the sacrificial nanosheet layers include SiGe, for example, SiGe having a Ge concentration of about 25 atomic percent. The sacrificial nanosheet layers can have a thickness of, for example, about 12 nm. The mask layer may be formed by depositing known hard mask material(s) upon the top sacrificial nanosheet layer.

In some embodiments, the alternating series of sacrificial nanosheet layers and channel nanosheet layers are formed by epitaxially growing one layer and then the next until the desired number and desired thicknesses of such layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, di silane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

Next, the sacrificial nanosheet layers and channel nanosheet layers may be patterned by removing respective undesired portions while retaining respective desired portions. Similarly, the mask layer may be patterned by removing respective undesired portions while retaining respective desired portions, as depicted.

The removal of undesired portions of sacrificial nanosheets, removal of undesired portions of the channel nanosheets, and removal of undesired portions of the mask layer can be accomplished using, for example, a sidewall image transfer (SIT) operation, a wet etch process, or a dry etch process. The removal of such undesired portions may further remove undesired portions of substrate 102 there below. Such removal may form a gate cut trench between the first device region 203 and the second device region 205.

Desired portions of sacrificial nanosheet layers, desired portions of the channel nanosheet layers, and desired portions of the mask may be retained and generally form respective nanosheet stacks within first device region 203 and within second device region 205.

A sacrificial gate cut plug may be formed within the gate cut trench by depositing a first dielectric material upon the substrate 102 and between the respective nanosheet stacks within the first device region 203 and within the second device region 205. For example, the sacrificial gate cut plug can be formed by any suitable techniques such as deposition (ALD, CVD, etc.) followed by directional etch. As such, the sacrificial gate cut plug physically and, at least partially, electrically separates the respective nanosheet stacks within first device region 203 and within the second device region 205. The sacrificial gate cut plug can have a width of from about 5 nm to about 40 nm. In some embodiments, the sacrificial gate cut plug can have a width of from about 10 nm to about 20 nm, although other widths are within the contemplated scope of the invention. Exemplary sacrificial gate cut plug materials may be, but are not limited to: SiN, SiC, SiON, SiOC, SiCN, BN, SiBN, SiBCN, SiOCN, $SiO_x$, combinations thereof, etc. The sacrificial gate cut plug can be a low-k material having a dielectric constant less than about 7, less than about 5.

After deposition, excessive sacrificial gate cut plug material can be removed by etching back or polish process. Removal of the mask 118 can be accomplished using, for example, a selective wet etch process, or a selective dry etch process, or other subtractive operation, as is known in the art.

Next a sacrificial gate within the first device region 203 and a sacrificial gate within the second device region 205 may be formed by initially depositing a sacrificial gate liner (e.g. a dielectric, oxide, or the like) upon substrate 102 and upon the nanosheet stacks within the first device region 203 and within the second device region 205. The gate dielectric may also be formed around exposed portions of the sacrificial gate cut plug. The sacrificial gates may further be formed by subsequently depositing a sacrificial gate material (e.g. a dielectric, amorphous silicon, or the like) upon the sacrificial gate liner. A CMP may planarize the upper surface of the sacrificial gates and the sacrificial gate cut plug. A gate mask may be formed upon the top surface of the sacrificial gates, respectively, and gate spacers may be formed upon opposing sidewalls of the sacrificial gates.

Gate spacers may laterally abut each sacrificial gate and associated gate mask. Gate spacers may be formed, e.g., by a combination of deposition and etching, over the initial structure of nanosheet stack and laterally adjacent to sacrificial gate and gate mask. Gate spacers may be comprised of a variety of different materials, such as silicon nitride, SiBCN, SiNC, SiN, SiCO, and SiNOC, etc., and they may each be made of the same or different materials.

The channel nanosheets 210, 214 may be exposed by laterally recessing alternating nanosheets to yield a plurality of recesses in each nanosheet stack. The lateral recessing of alternating nanosheets can be provided, e.g., by application of a wet etchant selective to the composition of the sacrificial nanosheets (e.g., SiGe or similar crystalline semiconductors), and which leaves other structures (e.g., substrate 102, channel nanosheets 210, 214, etc.) substantially intact.

Channel nanosheet spacers may be formed by depositing an insulative material, such as a dielectric, can be deposited to pinch off these previously formed recesses to yield a channel nanosheet spacer positioned therewithin, (e.g., between alternating channel nanosheets 210, 214 within the nanosheet stack).

Source or Drain (S/D) regions may be formed by epitaxially growing a source/drain epitaxial region between respective pairs of nanosheet stacks, e.g., from exposed sidewalls of channel nanosheets 210, 214 and upper surface of substrate 102. In some embodiments, the S/D region(s) is formed by in-situ doped epitaxial growth. In some embodiments, epitaxial growth and/or deposition processes may be selective to forming on semiconductor surfaces, and may not deposit material on dielectric surfaces, such as silicon dioxide or silicon nitride surfaces.

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments the source drain epitaxial growth conditions that promote in-situ boron doped SiGe for P-type and phosphorus or arsenic doped silicon or Si:C for N-Type. The doping concentration in S/D can be in the range of $1\times10^{19}$ $cm^{-3}$ to $2\times10^{21}$ $cm^{-3}$, or preferably between $2\times10^{20}$ $cm^{-3}$ to $7\times10^{20}$ $cm^{-3}$.

Next, replacement gates may be formed. The replacement gates may be formed by exposing and removing the sacrificial gates, removing the remaining sacrificial nanosheets in the gate region, and forming replacement gates around the exposed portions of the channel nanosheets 210, 214.

Each replacement gate can comprise the gate dielectric 152, gate conductor(s) 150, 154, hereinafter referred to as replacement gates, and gate cap 151, 155, respectively. The replacement gates 150, 154 may include two inline gate structures with a first gate structure located in the first device region 203 and a second gate structure located in the second device region 205. These formed gates structures may be physically and, at least partially electrically, separated by the sacrificial gate cut plug material within the gate cut region 132.

Subsequently, the gate cut region 132 may be re-formed or otherwise re-exposed by removing the sacrificial gate cut plug therewithin. After such exposure, gate cut region 132 may include inner facing sidewall(s) of gate mask 151, inner facing sidewall(s) of replacement gate 150, and inner facing sidewall portion(s) of substrate 102. Similarly, gate cut region 132 may include inner facing sidewall(s) of gate mask 155, inner facing sidewall(s) of replacement gate 154, and inner facing sidewall portion(s) of substrate 102. Further, after such exposure gate cut region 132 may also include a bottom or well surface as an exposed recessed portion of the substrate 102 that is below the top surface of substrate 102.

FIG. 11 depicts a cross-sectional view of semiconductor structure 200 shown after fabrication operations, in accordance with one or more embodiments. After such fabrication operations, semiconductor device 200 may include gate cut stressor 170 within gate cut region 132. The gate cut stressor 170 physically separates gate cap 151, replacement gate 150, and a portion of substrate 102 from the second device region 205. Similarly, the gate cut stressor 170 physically separates gate cap 155, replacement gate 154, and a portion of substrate 102 from the first device region 203.

Gate cut stressor 170 may be formed by depositing a dielectric material upon substrate 102 and upon the inner facing sidewalls of gate cut region 132. After formation of gate cut stressor 170, excessive gate cut stressor 170 material can be removed by an etching or polish process. Removal of the excess gate cut stressor 170 material can be accomplished using, for example, a selective wet etch process, or a selective dry etch process, or other subtractive removal technique, as is known in the art. As such, the top surface of gate cap 151, gate cap 155, and gate cut stressor 170 may be coplanar.

Gate cut stressor 170 has an internal or intrinsic tension or stress, such that there is an internally generated effective force $T_{170}$ that attempts to compress or shrink the gate cut stressor 170 internally pulling first device region 203 and toward the second device region 205 laterally or horizontally, as depicted. This internal tension applied to the gate material 150, 154 creates tensile stress within the gate material along the gate direction and within the nanosheets 210, 214 perpendicular to the nanosheet 210, 214 channel and current flow direction. In turn, this tensile stress may resultingly create a smaller compressive stress $TFI_{170}$ along nanosheets 210, 214 channel and current direction (into and/or out of the page, as depicted) through the stress mixing Poisson effect. These forces and stresses within nanosheets 210, 214 may improve hole mobility and/or electron mobility therewithin.

In one embodiment, the channels of nanosheets 210, 214 are aligned along <110> crystallographic direction, nanosheet surfaces 210a and 214a are {100} oriented, and nanosheet surfaces 210b and 214b are {110} oriented. In this arrangement, both hole mobility and electron mobility may improve on all surfaces 210a, 210b, 214a, and 214b. On surfaces 210a and 214a, hole mobility is improved through the primary tensile force $T_{170}$ and through the secondary compressive force $TFI_{170}$ while the electron mobility is improved through the primary tensile force $T_{170}$. On these surfaces 210a and 214a, hole mobility may improve by a larger factor. On surfaces 210b and 214b, the hole mobility is improved through the secondary compressive $TFI_{170}$ force while the electron mobility is improved through the primary tensile $T_{170}$ force. On these surfaces 210b and 214b, the electron mobility improves by a larger factor. The relative ratio of electron mobility and hole mobility improvement depends on nanosheet 210, 214 width (nanosheet lateral dimension in FIG. 11) that sets the ratio between surfaces 210a/214a and 210b/214b. Because the nanosheet 210, 214 width can be varied by design, the relative ratio of mobility improvement can be tuned in accordance with the specific circuit function. For CMOS logic switching circuits, wider nanosheets 210, 214 may provide a larger hole mobility improvement and faster switching speed per given footprint. For CMOS SRAM cells, narrow nanosheets 210, 214 may provide a larger electron mobility improvement and faster and more stable operation per given footprint.

Gate cut stressor 170 may be formed PECVD, or the like, such that respective process parameters, such as composition of carrier gases and reactive gases, substrate temperature, deposition pressure and, in particular, ion bombardment during the deposition, may significantly influence the finally obtained intrinsic stress of gate cut stressor 170 as deposited with respect to the underlying or otherwise surrounding material(s). High level of intrinsic tensile stress in the gate cut stressor 170 can be also produced by an annealing or curing step that induces shrinkage of gate cut material. This additional step can be conducted immediately after gate cut stressor deposition or later in the process flow. In one example, such additional annealing or curing step detaches hydrogen from within the gate cut stressor material producing stretched chemical bonds within that yield a high level of tensile intrinsic stress. For example, when gate cut stressor 170 is deposited and annealed within gate cut region 132 a high intrinsic tensile stress of up to 2 GPa or even significantly higher may be achieved by e.g., detaching hydrogen during or after deposition or, alternatively, reducing ion bombardment by establishing the deposition atmosphere with a low level of radio frequency (RF) power so as to obtain the desired internally generated effective force $T_{170}$ that attempts to compress or shrink the gate cut stressor 170 internally away from both first device region 203 and second device region 205 laterally.

Figure 12:
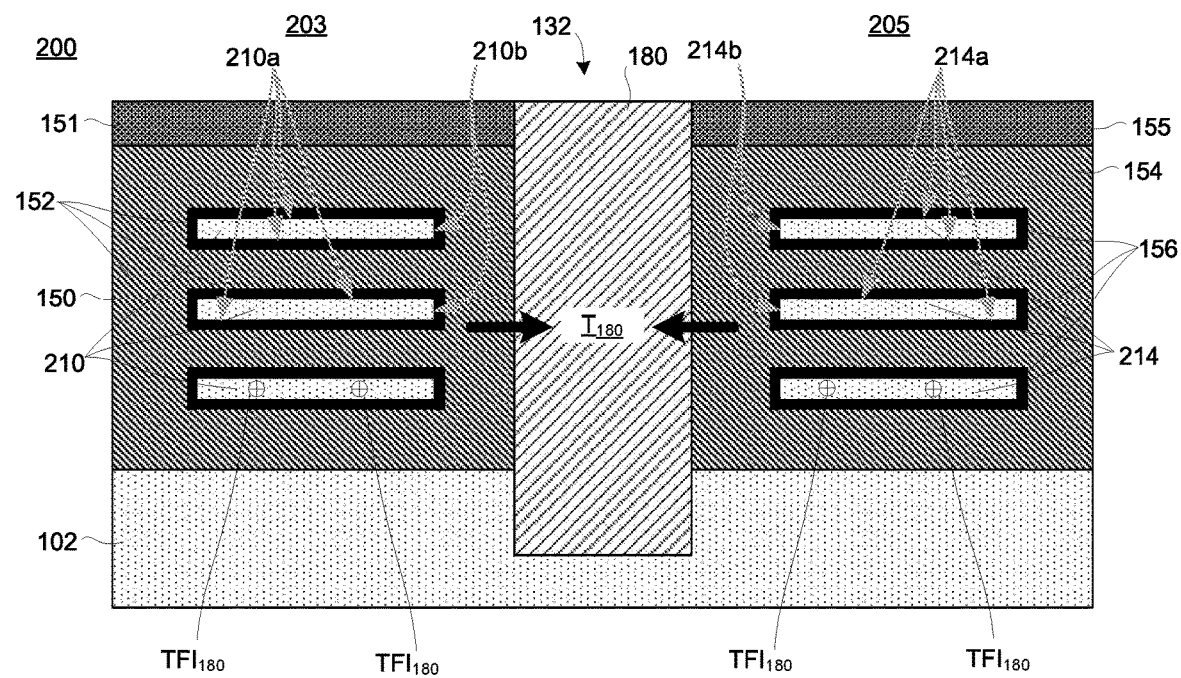

FIG. 12 depicts a cross-sectional view of semiconductor structure 200 shown after fabrication operations, in accordance with one or more embodiments. After such fabrication operations, semiconductor device 200 may include gate cut stressor 180 within gate cut region 132. The gate cut stressor 180 physically separates gate cap 151, replacement gate 150, and a portion of substrate 102 from the second device region 205. Similarly, the gate cut stressor 180 physically separates gate cap 155, replacement gate 154, and a portion of substrate 102 from the first device region 203.

Gate cut stressor 180 may be formed by depositing a dielectric material, different than the dielectric material of gate cut stressor 170, upon substrate 102 and upon the inner facing sidewalls of gate cut region 132. After formation of gate cut stressor 180, excessive gate cut stressor 180 material can be removed by an etching or polish process. As such, the top surface of gate cap 151, gate cap 155, and gate cut stressor 180 may be coplanar.

Gate cut stressor 180 has an internal or intrinsic tension or stress, such that there is an internally generated effective force $T_{180}$ that attempts to compress or shrink the gate cut stressor 180 internally pulling first device region 203 and toward the second device region 205 laterally or horizontally, as depicted. This internal tension applied to the gate material 150, 154 creates tensile stress within the gate material along the gate direction and within the nanosheets 210 and 214 perpendicular to the nanosheet 210 and 214 channel and current flow direction. In turn, this tensile stress may resultingly create a smaller compressive stress $TFI_{180}$ along nanosheets 210 and 214 channel and current direction (into and/or out of the page, as depicted) through the stress mixing Poisson effect. These forces and stresses within nanosheets 210 and 214 may improve hole mobility and/or electron mobility therewithin.

In one embodiment, the channels of nanosheets 210, 214 are aligned along <110> crystallographic direction, nanosheet surfaces 210a and 214a are {100} oriented, and nanosheet surfaces 210b and 214b are {110} oriented. In this arrangement, both hole mobility and electron mobility improve on all surfaces 210a, 210b, 214a, and 214b. On surfaces 210a and 214a, hole mobility is improved through the primary tensile force $T_{180}$ force and through the secondary compressive $TFI_{180}$ force while electron mobility is improved through the primary tensile $T_{180}$ force. On these surfaces 210a and 214a, hole mobility improves by a larger factor. On surfaces 210b and 214b, hole mobility is improved through the secondary compressive $TFI_{180}$ force while electron mobility is improved through the primary tensile $T_{180}$ force. On these surfaces 210b and 214b, electron mobility improves by a larger factor. The relative ratio of electron mobility and hole mobility improvement depends on nanosheet 210, 214 width (nanosheet lateral dimension in FIG. 12) that sets the ratio between surfaces 210a/214a and 210b/214b. Because the nanosheet 210, 214 width can be varied by design, the relative ratio of mobility improvement can be tuned in accordance with the specific circuit function.

For CMOS logic switching circuits, wider nanosheets 210, 214 provide a larger hole mobility improvement and faster switching speed per given footprint. For CMOS SRAM cells, narrow nanosheets 210, 214 provide a larger electron mobility improvement and faster and more stable operation per given footprint.

Gate cut stressor 180 may be formed by PECVD, or the like, such that respective process parameters, such as composition of carrier gases and reactive gases, substrate temperature, deposition pressure and, in particular, ion bombardment during the deposition, may significantly influence the finally obtained intrinsic stress of gate cut stressor 180 as deposited with respect to the underlying or otherwise surrounding material(s). High level of intrinsic tensile stress in the gate cut stressor 180 can be also produced by an annealing or curing step that induces shrinkage of gate cut material. This additional step can be conducted immediately after gate cut stressor deposition or later in the process flow. In one example, such additional annealing or curing step detaches hydrogen from within the gate cut stressor material producing stretched chemical bonds within that yield a high level of tensile intrinsic stress. For example, when gate cut stressor 180 is deposited and annealed within gate cut region 132 a high intrinsic tensile stress of up to 2 GPa or even significantly higher may be achieved by e.g., detaching hydrogen during or after deposition or, alternatively, reducing ion bombardment by establishing the deposition atmosphere with a low level of radio frequency (RF) power so as to obtain the desired internally generated effective force $T_{180}$ that attempts to compress or shrink the gate cut stressor 180 internally away from both first device region 203 and second device region 205 laterally.

Figure 13:
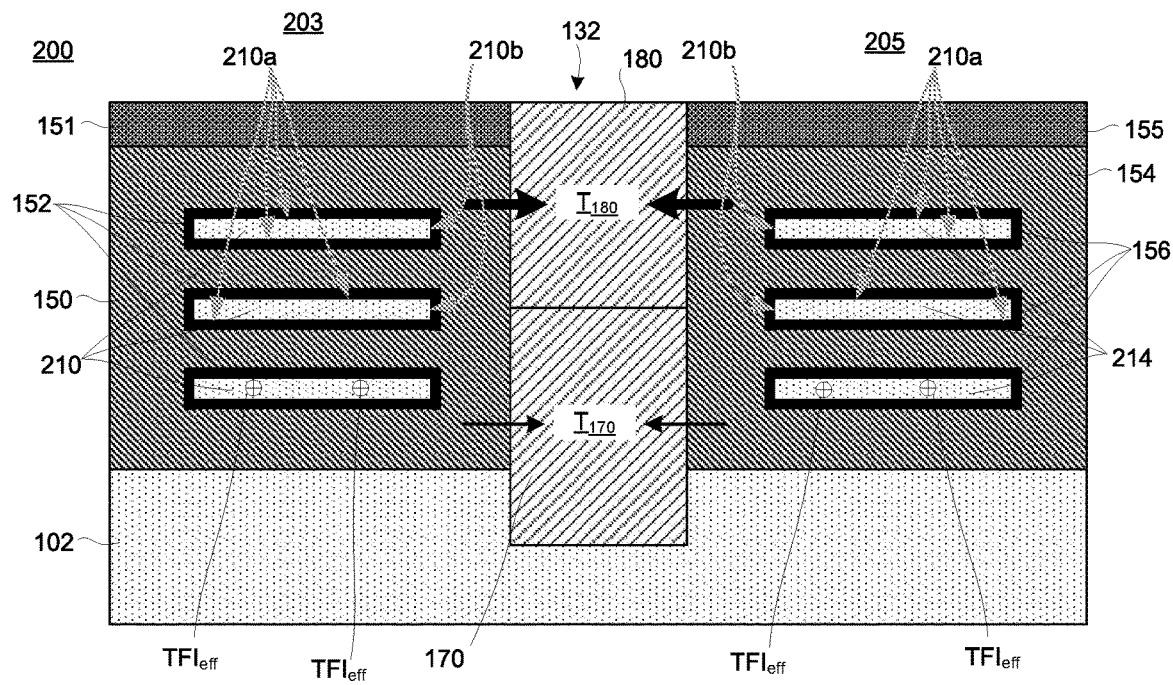

FIG. 13 depicts a cross-sectional view of semiconductor structure 200 shown after fabrication operations, in accordance with one or more embodiments. After such fabrication operations, semiconductor device 200 may include gate cut stressor 180 and gate cut stressor 170 within gate cut region 132. Gate cut stressor 170 may be located in a lower portion of gate cut region 132 and gate cut stressor 180 may be located in an upper portion of gate cut region 132, or vice versa.

The gate cut stressors 170, 180 physically separate gate cap 151, replacement gate 150, and/or a portion of substrate 102 from the second device region 205, respectively. Similarly, the gate cut stressors 170, 180 physically separates gate cap 155, replacement gate 154, and/or a portion of substrate 102 from the first device region 203, respectively.

As depicted, gate cut stressor 170 may be initially formed by depositing the gate cut stressor 170 dielectric material upon substrate 102, upon sidewall portions of substrate 102, and upon a lower portion of the inner facing sidewalls of gate cut region 132. Subsequently, gate cut stressor 180 may be formed by depositing the gate cut stressor 180 dielectric material upon gate cut stressor 170 and upon an upper portion of the inner facing sidewalls of gate cut region 132. Alternatively, subsequently to forming the gate cut stressor 170, the gate cut stressor 180 can be formed by curing a top portion of the gate cut stressor 170, thereby effectively forming gate cut stressor 108 that has a higher tensile stress within. In some implementations, curing the entire gate cut stressor 170 to cause a uniform intrinsic tensile stress may not be feasible due to a high aspect ratio of gate cut region 132.

Alternatively, gate cut stressor 180 may be initially formed by depositing the gate cut stressor 180 dielectric material upon substrate 102, upon sidewall portions of substrate 102, and upon a lower portion of the inner facing sidewalls of gate cut region 132. Subsequently, gate cut stressor 170 may be formed by depositing the gate cut stressor 170 dielectric material upon gate cut stressor 180 and upon an upper portion of the inner facing sidewalls of gate cut region 132.

After formation of gate cut stressor 170, 180, excessive gate cut stressor 170, 180 material can be removed by an etching or polish process. As such, the top surface of gate cap 151, gate cap 155, and gate cut stressor 170 or gate cut stressor 180 may be coplanar.

The internally generated tensile force $T_{180}$ is generally larger than internally generated tensile force $T_{170}$. This internal tension applied to the gate material 150, 154 creates tensile stress within the gate material along the gate direction and within the nanosheets 210 and 214 perpendicular to the nanosheet 210 and 214 channel and current flow direction. In turn, this tensile stress may resultingly create a smaller compressive stress $TFI_{eff}$ along nanosheets 210 and 214 channel and current direction (into and/or out of the page, as depicted) through the stress mixing Poisson effect.

In one embodiment, the channels of nanosheets 210, 214 are aligned along <110> crystallographic direction, nanosheet 210 and 214 surfaces 210a and 214a are {100} oriented, and nanosheet 210 and 214 surfaces 210b and 214b are {110} oriented. In this arrangement, both hole mobility and electron mobility improve on all surfaces 210a, 210b, 214a, and 214b. On surfaces 210a and 214a, the hole mobility is improved through the primary tensile $T_{180}$ and $T_{170}$ forces and through the secondary compressive $TFI_{eff}$ force while the electron mobility is improved through the primary tensile $T_{180}$ and $T_{170}$ forces. On these surfaces 210a and 214a, hole mobility improves by a larger factor. On surfaces 210b and 214b, hole mobility is improved through the secondary compressive $TFI_{eff}$ force while electron mobility is improved through the primary tensile $T_{180}$ and $T_{170}$ forces. On these surfaces 210b and 214b, electron mobility improves by a larger factor. The amount mobility improvement will be different for top and bottom nanosheets and this can be used to tune desired mobility improvement according to a specific circuit function. The relative ratio of electron mobility and hole mobility improvement also depends on nanosheet 210 and 214 width (nanosheet lateral dimension in FIG. 13) that sets the ratio between surfaces 210a/214a and 210b/214b. Because the nanosheet 210 and 214 width can be varied by design, the relative ratio of mobility improvement can be further tuned in accordance with the specific circuit function. For CMOS logic switching circuits, wider nanosheets 210 and 214 provide a larger hole mobility improvement and faster switching speed per given footprint. Additionally, placing pFET channel nanosheets 210 and 214 in a proximity of the stronger stressor 180 further improves hole mobility and switching speed per given footprint. For CMOS SRAM cells, narrow nanosheets 210 and 214 provide a larger electron mobility improvement and a faster and more stable operation per given footprint. Additionally, placing nFET channel nanosheets 210 and 214 in a proximity of the stronger stressor 180 and placing pFET channel nanosheets 210 and 214 in a proximity of the weaker stressor 170 provide even faster and more stable SRAM cell operation per given footprint.

In implementations where relatively improved hole mobility or electron mobility would be beneficial in an upper nanosheets 210, 214, it may be beneficial to initially form gate cut stressor 170 within the lower portion of gate cut region 132 and then to subsequently form gate cut stressor 180 upon the gate cut stressor 170 within an upper portion of gate cut region 132.

Alternatively, in implementations where relatively improved hole mobility or electron mobility would be beneficial in an lower nanosheets 210, 214, it may be beneficial to initially form gate cut stressor 180 within the lower portion of gate cut region 132 and then to subsequently form gate cut stressor 170 upon the gate cut stressor 180 within the upper portion of gate cut region 132.

Figure 14:
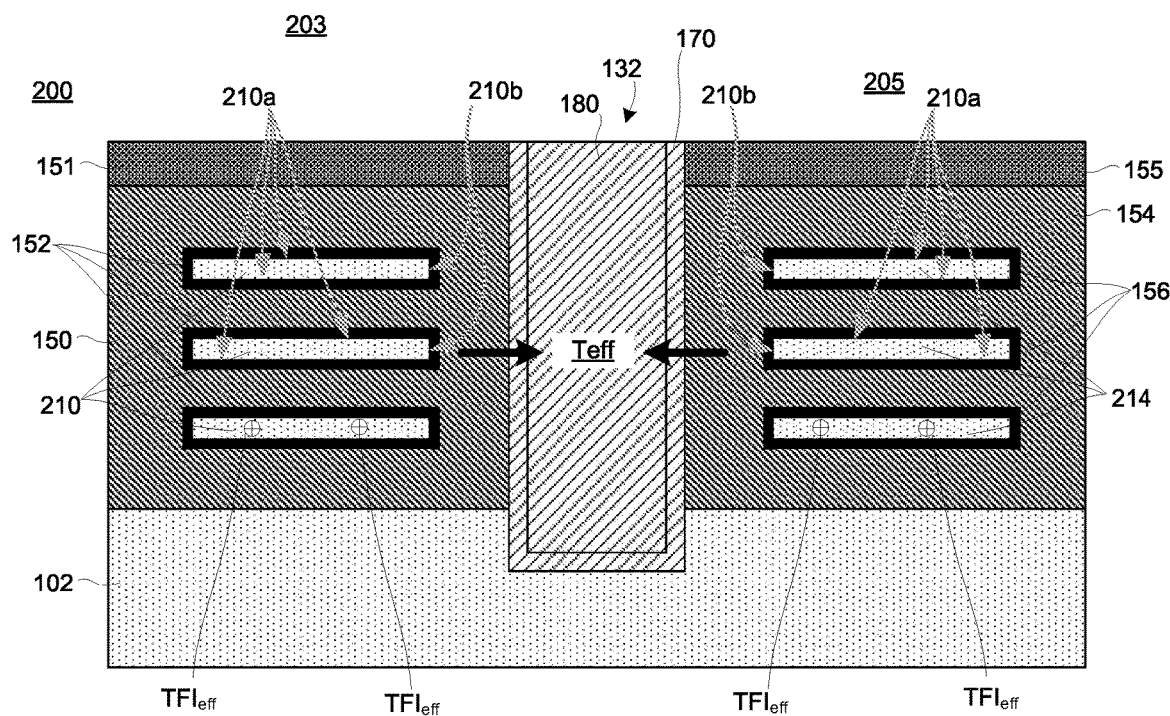

FIG. 14 depicts a cross-sectional view of semiconductor structure 200 shown after fabrication operations, in accordance with one or more embodiments. After such fabrication operations, semiconductor device 200 may include gate cut stressor 180 and gate cut stressor 170 within gate cut region 132. Gate cut stressor 170 may be a liner upon the internal sidewalls of gate cut region 132 and gate cut stressor 180 may be located upon gate cut stressor 170 and filling the remaining gate cut region 132, or vice versa.

The gate cut stressors 170, 180 physically separate gate cap 151, replacement gate 150, gate dielectric 152, and portions of substrate 102 from the second device region 205, respectively. Similarly, the gate cut stressors 170, 180 physically separates gate cap 155, replacement gate 154, and/or portions of substrate 102 from the first device region 203, respectively.

As depicted, gate cut stressor 170 may be initially formed by depositing the gate cut stressor 170 dielectric material upon substrate 102, upon sidewall portions of substrate 102, and upon the inner facing sidewalls of gate cut region 132. This gate cut stressor 170 liner layer can have a thickness of from about 1 nm to about 20 nm, although other thicknesses are within the contemplated scope. Subsequently, gate cut stressor 180 may be formed by depositing the gate cut stressor 180 dielectric material upon gate cut stressor 170 and may generally fill the remaining gate cut region 132.

Alternatively, gate cut stressor 180 may be initially formed by depositing the gate cut stressor 180 dielectric material upon substrate 102, upon sidewall portions of substrate 102, and upon the inner facing sidewalls of gate cut region 132. This gate cut stressor 180 liner layer can have a thickness of from about 1 nm to about 20 nm, although other thicknesses are within the contemplated scope. Subsequently, gate cut stressor 170 may be formed by depositing the gate cut stressor 170 dielectric material upon gate cut stressor 180 and may generally fill the remaining gate cut region 132.

After formation of gate cut stressor 170, 180, excessive gate cut stressor 170, 180 material can be removed by an etching or polish process. As such, the top surface of gate cap 151, gate cap 155, gate cut stressor 170, and gate cut stressor 180 may be coplanar.

The internally generated tensile force $T_{eff}$ is applies stress to the gate material 150, 154 creating tensile stress within the gate material along the gate direction and within the nanosheets 210 and 214 perpendicular to the nanosheet 210 and 214 channel and current flow direction. In turn, this tensile stress may resultingly create a smaller compressive stress $TFI_{eff}$ along nanosheets 210 and 214 channel and current direction (into and/or out of the page, as depicted) through the stress mixing Poisson effect. These forces and stresses within nanosheets 210, 214 may improve hole mobility and/or electron mobility therewithin, as described herein.

Figure 15:
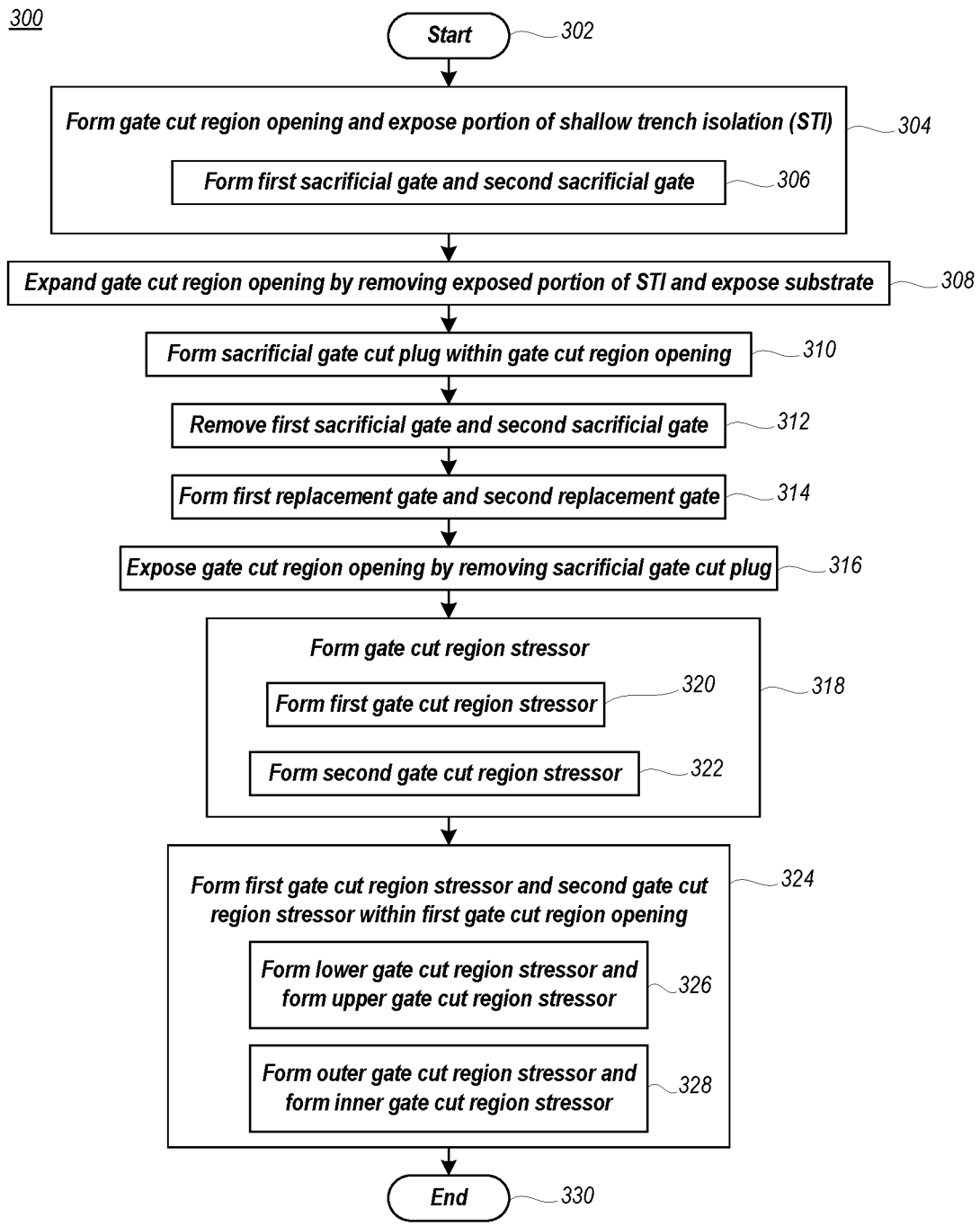
FIG. 15 is a flow diagram of a semiconductor device fabrication method, in accordance with one or more embodiments.

FIG. 15 is a flow diagram of semiconductor device 100 fabrication method 300, in accordance with one or more embodiments. Method 300 begins at block 302 and may continue with forming gate cut region 130 that exposes a portion of STI 112 (block 304). The gate cut region 130 may effectively split sacrificial gate 120 into sacrificial gate 121 within the first device region 103 and sacrificial gate 123 within the second device region (block 306).

Method 300 may continue with forming gate cut region 132 by expanding gate cut region 130 by removing the exposed portion of STI 112 and exposing a portion of the underlying substrate 102 (block 308). Gate cut region 130 may alternatively be formed by further partially recessing a portion of the underlying substrate 102.

Method 300 may continue with forming sacrificial gate cut plug 140 within the gate cut region 132 (block 310). Method 300 may continue with removing sacrificial gate 121 and sacrificial gate 123 (block 312) and forming replacement gates in place there of (block 314). For example, in place of the removed sacrificial gate 121, a gate dielectric 152 may be formed upon STI region 113 and upon fins 110, a replacement gate 150 may be formed upon the gate dielectric 152, and a gate cap 151 may be formed upon the replacement gate 150. Similarly, in place of the removed sacrificial gate 123, a gate dielectric 156 may be formed upon STI region 113 and upon fins 114, a replacement gate 154 may be formed upon the gate dielectric 156, and a gate cap 155 may be formed upon the replacement gate 154.

Method 300 may continue with re-exposing or otherwise re-forming gate cut region 132 by removing sacrificial gate cut plug 140 (block 316) and forming a gate cut stressor within the re-exposed gate cut region 132 (block 318). For example, gate cut stressor 170 may be formed within the gate cut region 132 (block 320) or gate cut stressor 180 may be formed within the gate cut region (block 322). Alternatively, gate cut stressor 170 may be formed within a first gate cut region 132 and gate cut stressor 180 may be formed within a second or different gate cut region 132. Alternatively, method 300 may continue with forming gate cut stressor 170 and with forming gate cut stressor 180 in the same gate cut region 132 (block 324). For example, gate cut stressor 170 may be formed in a lower portion of gate cut region 132 and gate cut stressor 180 may be formed upon the gate cut stressor 170 in an upper portion of gate cut region 132, or vice versa (block 326). Alternatively, gate cut stressor 170 may be formed as a liner within gate cut region 132 and gate cut stressor 180 may be formed upon the gate cut stressor 170 filling the remaining portions of gate cut region 132, or vice versa (block 328). Method 300 may end at block 330.

Figure 16:
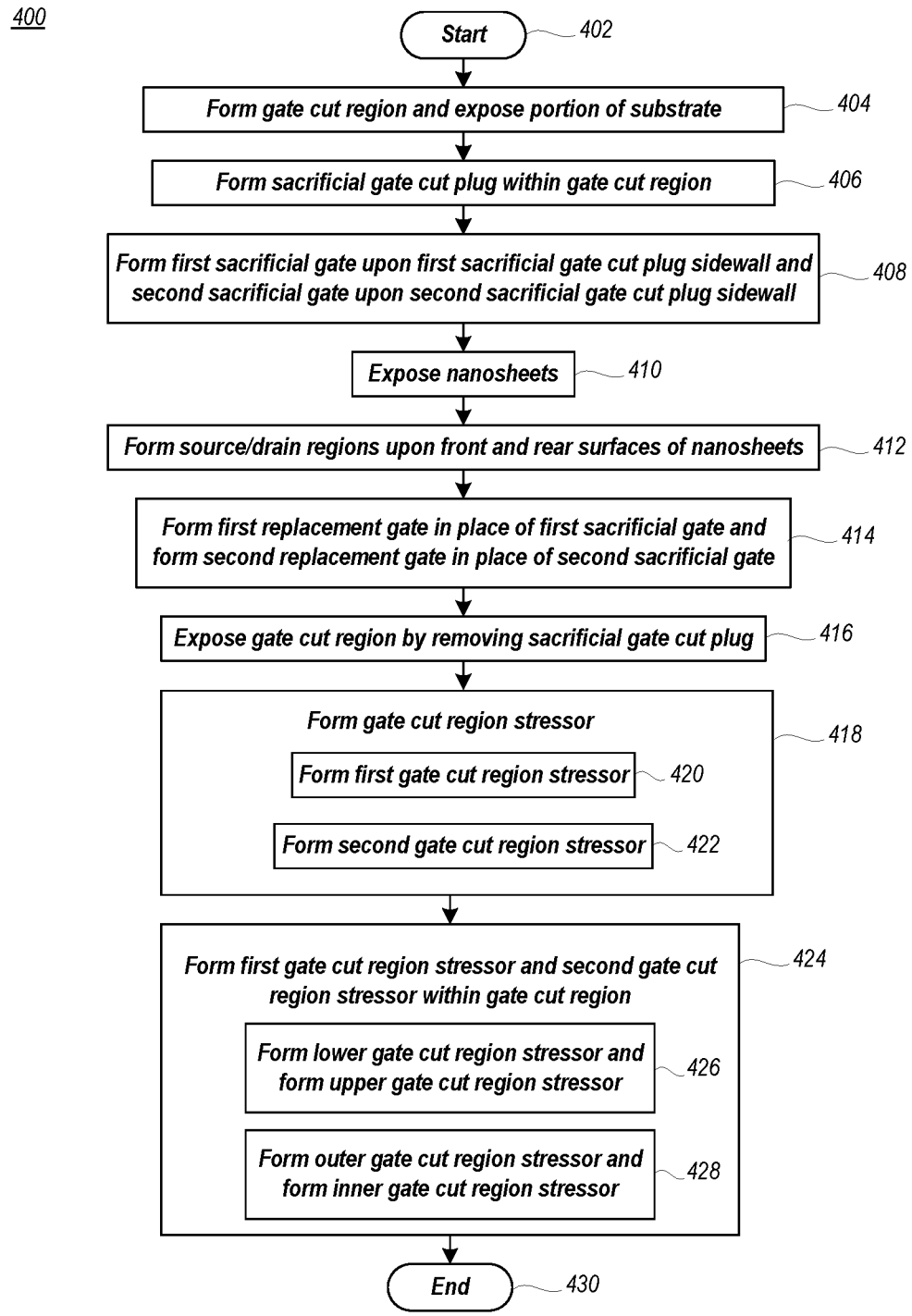
FIG. 16 is a flow diagram of a semiconductor device fabrication method, in accordance with one or more embodiments.

FIG. 16 is a flow diagram of semiconductor device 200 fabrication method 400, in accordance with one or more embodiments. Method 400 begins at block 402.

In some embodiments, method 400 may include forming, choosing, providing, or the like, substrate 102 with a preferred or predetermined crystallographic orientation(s) and structures, forming alternating layers of sacrificial nanosheets and channel nanosheets, and forming a mask layer upon a top sacrificial nanosheet layer. Next, the sacrificial nanosheet layers, channel nanosheet layers, and mask layer may be patterned. The removal of such undesired portions may further remove undesired portions of substrate 102 there below. Such removal may form a gate cut region between the first device region 203 and the second device region 205 (block 404).

Desired portions of sacrificial nanosheet layers, desired portions of the channel nanosheet layers, and desired portions of the mask may be retained and generally form a nanosheet stack within first device region 203 and a nanosheet stack within second device region 205. The gate cut region may physically separate the nanosheet stack within first device region 203 and the nanosheet stack within second device region 205.

Method 400 may continue with forming a sacrificial gate cut plug within the gate cut region between the first device region 203 and the second device region 205 by depositing a dielectric material upon the substrate 102 and between the nanosheet stacks (block 406). As such, the sacrificial gate cut plug physically and, at least partially, electrically separates the nanosheet stack within first device region 203 and the nanosheet stack within second device region 205.

Method 400 may continue with forming a sacrificial gate within the first device region 203 and a sacrificial gate within the second device region 205 (block 408). For example, the sacrificial gates may be formed by initially removing the mask upon the nano sheet stacks, thereby exposing an upper portion of the sacrificial gate cut plug, and further depositing a sacrificial gate liner upon substrate 102 and upon the nanosheet stacks within the first device region 203 and within the second device region 205, respectively. The sacrificial gate liner may also be formed around exposed portions of the sacrificial gate cut plug. The sacrificial gates may further be formed by subsequently depositing a sacrificial gate material upon the sacrificial gate liner.

The channel nanosheets 210, 214 may be exposed by laterally recessing alternating nanosheets to yield a plurality of recesses in each nanosheet stack (block 410). The lateral recessing of alternating nanosheets can be provided, e.g., by application of a wet etchant selective to the composition of the sacrificial nanosheets (e.g., SiGe or similar crystalline semiconductors), and which leaves other structures (e.g., substrate 102, channel nanosheets 210, 214, etc.) substantially intact.

Source or Drain (S/D) regions may be formed (block 412) by epitaxially growing a source/drain epitaxial region between front and rear surfaces of respective nanosheet stacks, e.g., from exposed sidewalls of channel nanosheets 210, 214 and/or upper surface of substrate 102.

Method 400 may continue by forming replacement gates in place of the sacrificial gate (block 414). The replacement gates may be formed by exposing and removing the sacrificial gates, thereby exposing an upper portion of the sacrificial gate cut plug, removing the remaining sacrificial nanosheets in the gate region, and forming replacement gates around the exposed portions of the channel nanosheets 210, 214 and upon a respective sidewall of the exposed upper portion of the sacrificial gate cut plug.

Method 400 may continue with exposing gate cut region 132 by removing the sacrificial gate cut plug. After such exposure, gate cut region 132 may include inner facing sidewall(s) of gate mask 151, inner facing sidewall(s) of replacement gate 150, and inner facing sidewall portion(s) of substrate 102. Similarly, gate cut region 132 may include inner facing sidewall(s) of gate mask 155, inner facing sidewall(s) of replacement gate 154, and inner facing sidewall portion(s) of substrate 102. Further, after such exposure gate cut region 132 may also include a bottom or well surface as an exposed recessed portion of the substrate 102 that is below the top surface of substrate 102.

Method 400 may continue with forming a gate cut stressor within the re-exposed gate cut region 132 (block 418). For example, gate cut stressor 170 may be formed within the gate cut region 132 (block 420) or gate cut stressor 180 may be formed within the gate cut region 132 (block 422). Alternatively, gate cut stressor 170 may be formed within a first gate cut region 132 and gate cut stressor 180 may be formed within a second or different gate cut region 132 formed within semiconductor device 200. Alternatively, method 400 may continue with forming gate cut stressor 170 and with forming gate cut stressor 180 in the same gate cut region 132 (block 424). For example, gate cut stressor 170 may be formed in a lower portion of gate cut region 132 and gate cut stressor 180 may be formed upon the gate cut stressor 170 in an upper portion of gate cut region 132, or vice versa (block 426). Alternatively, gate cut stressor 170 may be formed as a liner within gate cut region 132 and gate cut stressor 180 may be formed upon the gate cut stressor 170 filling the remaining portions of gate cut region 132, or vice versa (block 428). Method 400 may end at block 430.

The method flow diagrams depicted herein are exemplary. There can be many variations to the diagram or operations described therein without departing from the spirit of the embodiments. For instance, the operations can be performed in a differing order, or operations can be added, deleted or modified. All of these variations are considered a part of the claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
   one or more first fins that extend from a planar top surface of a substrate within a first device region;
   one or more second fins that extend from the planar top surface of the substrate within a second device region;
   first shallow trench isolation (STI) within the first device region, the first STI upon the planar top surface of the substrate and upon and between respective lower portion(s) of the one or one or more first fins, the first STI comprising a first STI sidewall that faces the second device region;
   second STI within the second device region, the second STI upon the planar top surface of the substrate and upon and between respective lower portion(s) of the one or one or more second fins, the second STI comprising a second STI sidewall that faces the first device region;
   a first gate within the first device region, the first gate upon the first STI and upon and between respective upper portion(s) of the one or more first fins, the first gate comprising a first gate sidewall that faces the second device region;
   a second gate within the second device region, the second gate upon the second STI and upon and between respective upper portion(s) of the one or more second fins, the second gate comprising a second gate sidewall that faces the first device region; and
   a gate cut stressor upon the planar top surface of the substrate, upon the first STI sidewall, upon the second STI sidewall, upon the first gate sidewall, and upon the second gate sidewall, the gate cut stressor comprising a first gate cut stressor material and a second gate cut stressor material directly upon the first gate cut stressor material, wherein the second gate cut stressor material different from the first gate cut stressor material and wherein the gate cut stressor comprises an intrinsic stress that applies a tensile force to the first gate and to the second gate perpendicular to the first fins and to the second fins.

2. The semiconductor device of claim 1, wherein the first STI sidewall is coplanar with the first gate sidewall and wherein the second STI sidewall is coplanar with the second gate sidewall.

3. The semiconductor device of claim 1, wherein the gate cut stressor is formed of a different material relative to the first STI and relative to the second STI.

4. The semiconductor device of claim 1, wherein the second gate cut stressor material is directly upon a top surface of the first gate cut stressor material.

5. The semiconductor device of claim 1, wherein the first gate cut stressor material is a liner and the second gate cut stressor material is directly upon the liner.

6. The semiconductor device of claim 1, further comprising:
   a first gate cap within the first device region, the first gate cap upon the first gate, the first gate cap comprising a first gate cap sidewall that faces the second device region;
   a second gate cap within the second device region, the second gate cap upon the second gate, the second gate cap comprising a second gate cap sidewall that faces the first device region; and
   wherein the gate cut stressor is further upon the first gate cap sidewall and upon the second gate cap sidewall.

7. A semiconductor device comprising:
   a substrate comprising a planar top surface;
   a first gate cut stressor within a first gate cut region that separates a first transistor region from a second transistor region, wherein the first gate cut stressor is directly upon the planar top surface and applies a first tensile force to a first gate perpendicular to a first channel in the first transistor region and to a second gate perpendicular to a second channel in the second transistor region; and
   a second gate cut stressor within a second gate cut region that separates a third transistor region from a fourth transistor region, wherein the second gate cut stressor is directly upon the planar top surface and applies a second tensile force to a third gate perpendicular to a third channel in the third transistor region and to a fourth gate perpendicular to a fourth channel in the fourth transistor region, wherein the second gate cut stressor is formed of a different material relative to the first gate cut stressor.

8. The semiconductor device of claim 7, wherein each of the first transistor region, the second transistor region, the third transistor region, and the fourth transistor region comprise:
   a shallow trench isolation (STI) directly upon the planar top surface;
   a gate directly upon the STI; and
   a gate cap directly upon the gate.

9. The semiconductor device of claim 8, wherein the first gate cut stressor physically connects the first transistor region STI with the second transistor region STI and wherein the first gate cut stressor further physically connects the first transistor region gate with the second transistor region gate.

10. The semiconductor device of claim 9, wherein the second gate cut stressor physically connects the third transistor region STI with the fourth transistor region STI and wherein the second gate cut stressor further physically connects the third transistor region gate with the fourth transistor region gate.

11. The semiconductor device of claim 10, wherein the first transistor region further comprises an N-type transistor, wherein the second transistor region further comprises a P-type transistor, wherein the third transistor region further comprises an N-type transistor, and wherein the fourth transistor region further comprises a P-type transistor.

12. The semiconductor device of claim 10, wherein the first transistor region further comprises an first N-type transistor, wherein the second transistor region further comprises a second N-type transistor, wherein the third transistor region further comprises a first P-type transistor, and wherein the fourth transistor region further comprises a second P-type transistor.

13. The semiconductor device of claim 10, wherein the first transistor region further comprises an first P-type transistor, wherein the second transistor region further comprises a second P-type transistor, wherein the third transistor region further comprises a first N-type transistor, and wherein the fourth transistor region further comprises a second N-type transistor.

14. The semiconductor device of claim 10, wherein the first gate cut stressor physically connects the first transistor region gate cap with the second transistor region gate cap.

15. The semiconductor device of claim 14, wherein the second gate cut stressor physically connects the third transistor region gate cap with the fourth transistor region gate cap.

16. A semiconductor device comprising:
   a first gate associated with a first transistor;
   a second gate associated with a second transistor;
   a gate cut region adequately electrically separating a first sidewall of the first gate from a second sidewall of the second gate; and
   a first gate cut stressor comprising a first gate cut stressor material and a second gate cut stressor material directly upon the first gate cut stressor material, the second gate cut stressor material different from the first gate cut stressor material, the first gate cut stressor directly connected to the first sidewall of the first gate and directly connected to the sidewall of the second gate, wherein the first gate cut stressor applies a first tensile force against the first gate substantially perpendicular to the first sidewall and applies the first tensile force against the second gate substantially perpendicular to the second sidewall.

17. The semiconductor device of claim 16, further comprising:
   a second gate cut stressor directly connected to the first sidewall of the first gate, directly connected to the sidewall of the second gate, and directly connected to the first gate cut stressor, wherein the second gate cut stressor applies a second tensile force against the first gate substantially perpendicular to the first sidewall and applies a second tensile force against the second gate substantially perpendicular to the second sidewall.

18. The semiconductor device of claim 16, further comprising:
   a second gate cut stressor directly connected to the first gate cut stressor, wherein the second gate cut stressor applies a second tensile force against the first gate substantially perpendicular to the first sidewall and applies a second tensile force against the second gate substantially perpendicular to the second sidewall.

19. The semiconductor device of claim 16, wherein the first sidewall of the first gate and the second sidewall of the second gate are substantially vertical and wherein the first tensile force and the second tensile force are substantially horizontal.

20. The semiconductor device of claim 16, wherein the first tensile force applies a compressive stress to one or more channels associated with the first transistor and wherein the second tensile force applies a compressive stress to one or more channels associated with the second transistor.

* * * * *